United States Patent
Yamazaki

(10) Patent No.: US 9,490,369 B2
(45) Date of Patent: *Nov. 8, 2016

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/556,371

(22) Filed: Dec. 1, 2014

(65) Prior Publication Data

US 2015/0187949 A1 Jul. 2, 2015

Related U.S. Application Data

(63) Continuation of application No. 13/914,156, filed on Jun. 10, 2013, now Pat. No. 8,901,557.

(30) Foreign Application Priority Data

Jun. 15, 2012 (JP) .................. 2012-136437

(51) Int. Cl.
*H01L 29/786* (2006.01)
*H01L 29/51* (2006.01)
*H01L 29/267* (2006.01)

(52) U.S. Cl.
CPC ......... *H01L 29/7869* (2013.01); *H01L 29/267* (2013.01); *H01L 29/512* (2013.01); *H01L 29/518* (2013.01); *H01L 29/78693* (2013.01); *H01L 29/78696* (2013.01)

(58) Field of Classification Search
None
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    101617408 A    12/2009
EP      1737044 A    12/2006
(Continued)

OTHER PUBLICATIONS

US 9,276,130, 03/2016, Yamazaki (withdrawn)*
(Continued)

*Primary Examiner* — Joseph Schoenholtz
(74) *Attorney, Agent, or Firm* — Eric J. Robinson; Robinson Intellectual Property Law Office, P.C.

(57) ABSTRACT

High field-effect mobility is provided for a transistor including an oxide semiconductor. Further, a highly reliable semiconductor device including the transistor is provided. In a bottom-gate transistor including an oxide semiconductor layer, an oxide semiconductor layer functioning as a current path (channel) of the transistor is sandwiched between oxide semiconductor layers having lower carrier densities than the oxide semiconductor layer. In such a structure, the channel is formed away from the interface of the oxide semiconductor stacked layer with an insulating layer in contact with the oxide semiconductor stacked layer, i.e., a buried channel is formed.

60 Claims, 16 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,855,379 B2 | 12/2010 | Hayashi et al. |
| 7,994,500 B2 | 8/2011 | Kim et al. |
| 8,058,645 B2 | 11/2011 | Jeong et al. |
| 8,088,652 B2 | 1/2012 | Hayashi et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,421,083 B2 | 4/2013 | Yamazaki et al. |
| 8,502,221 B2 | 8/2013 | Yamazaki |
| 8,530,285 B2 | 9/2013 | Yamazaki et al. |
| 8,901,557 B2 * | 12/2014 | Yamazaki ................. 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0044701 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0024751 A1 | 2/2011 | Yamazaki et al. |
| 2011/0140100 A1 * | 6/2011 | Takata et al. ................. 257/43 |
| 2011/0180794 A1 * | 7/2011 | Yamazaki ................. 257/43 |
| 2011/0193083 A1 | 8/2011 | Kim et al. |
| 2011/0215328 A1 | 9/2011 | Morosawa et al. |
| 2011/0240991 A1 | 10/2011 | Yamazaki |
| 2011/0248246 A1 | 10/2011 | Ogita et al. |
| 2012/0045904 A1 * | 2/2012 | Choi ................. 438/786 |
| 2012/0119205 A1 | 5/2012 | Taniguchi et al. |
| 2012/0319102 A1 | 12/2012 | Yamazaki et al. |
| 2012/0319114 A1 | 12/2012 | Yamazaki et al. |
| 2013/0009209 A1 | 1/2013 | Yamazaki |
| 2013/0009220 A1 | 1/2013 | Yamazaki et al. |
| 2013/0020571 A1 | 1/2013 | Yamazaki et al. |
| 2013/0161608 A1 | 6/2013 | Yamazaki |
| 2013/0270552 A1 | 10/2013 | Yamazaki et al. |
| 2013/0320334 A1 | 12/2013 | Yamazaki et al. |
| 2013/0334533 A1 | 12/2013 | Yamazaki |
| 2014/0001465 A1 | 1/2014 | Yamazaki |
| 2015/0076488 A1 * | 3/2015 | Kishi et al. ................. 257/43 |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |

(56) References Cited

FOREIGN PATENT DOCUMENTS

| | | |
|---|---|---|
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2008-294136 A | 12/2008 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-073881 A | 4/2010 |
| JP | 2010-177431 A | 8/2010 |
| JP | 4571221 | 10/2010 |
| JP | 2011-124360 A | 6/2011 |
| JP | 2012-160679 A | 8/2012 |
| TW | 200901481 | 1/2009 |
| WO | WO-2004/114391 | 12/2004 |
| WO | WO-2008/105347 | 9/2008 |
| WO | WO-2008/133345 | 11/2008 |

OTHER PUBLICATIONS

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Fortunato.E et al., "Wide-Bandgap High-Mobility ZNO Thin-Film Transistors Produced At Room Temperature", Appl. Phys. Lett. (Appled Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

LI.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009. vol. 40, pp. 899-902.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2: AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZNO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS", J. SOC. INF. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In-Ga-Zn-Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu, Or Zn] at Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Sympsosium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. VAC. SCI. Technol. B (Journal of Vacuum Science & Technology B), Mar. 1, 2003, vol. 21, No. 2, pp. 800-803.
Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Liu.P. et al., "Nitrogenated amorphous InGaZnO thin film transistor", Appl. Phys. Lett. (Applied Physics Letters) , 2011, vol. 98, No. 5, pp. 052102-1-052102-3.

* cited by examiner

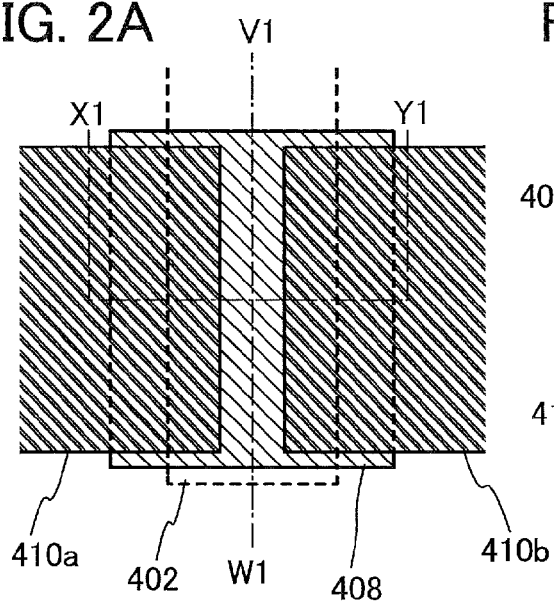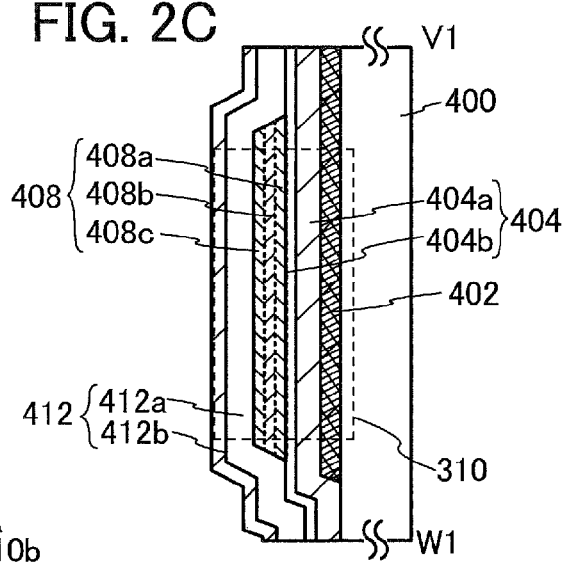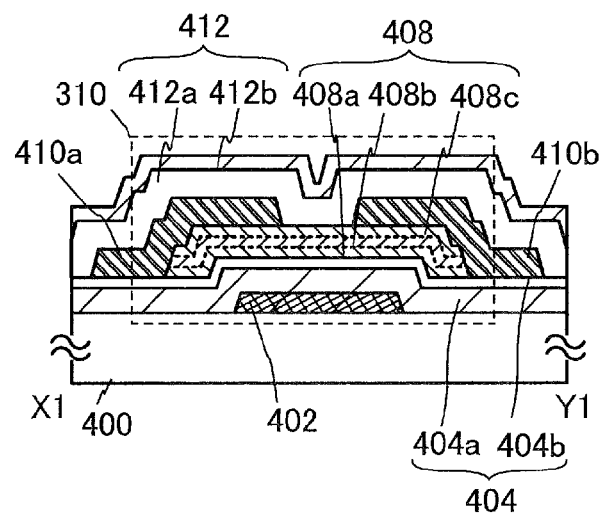

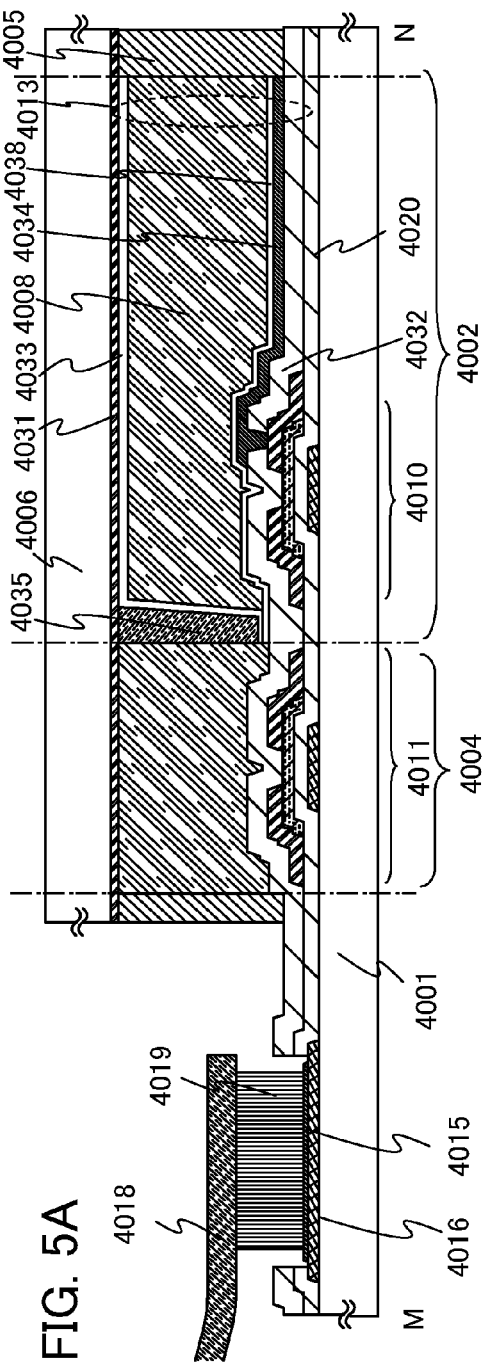
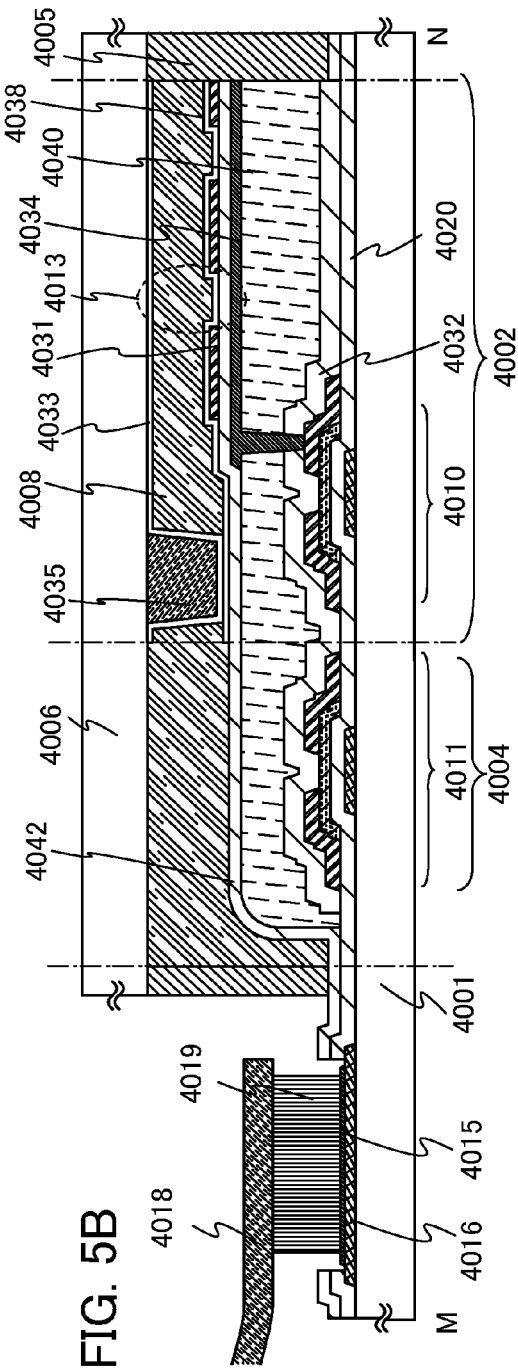
FIG. 5A
FIG. 5B

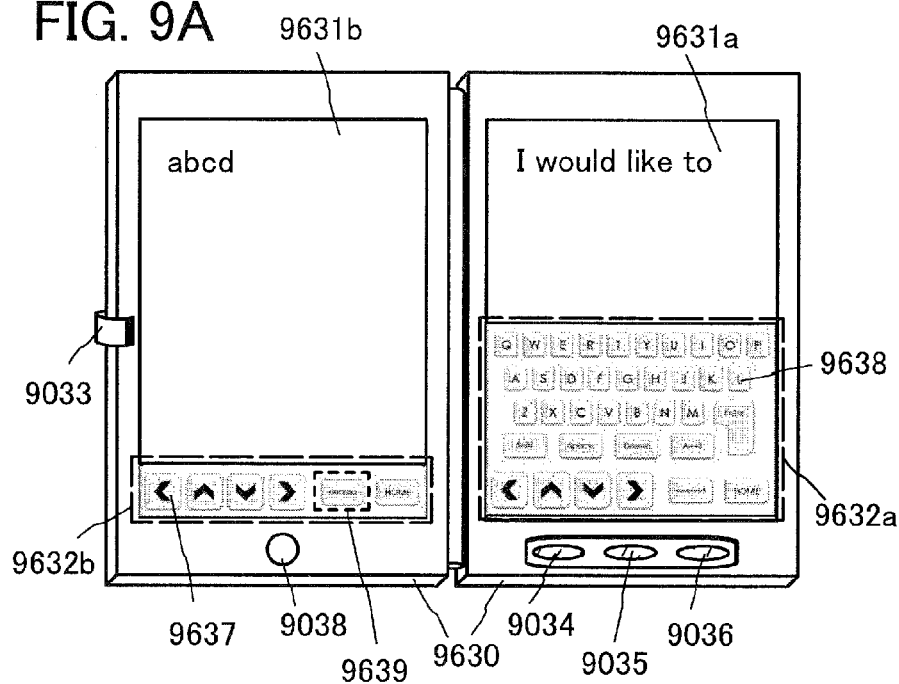
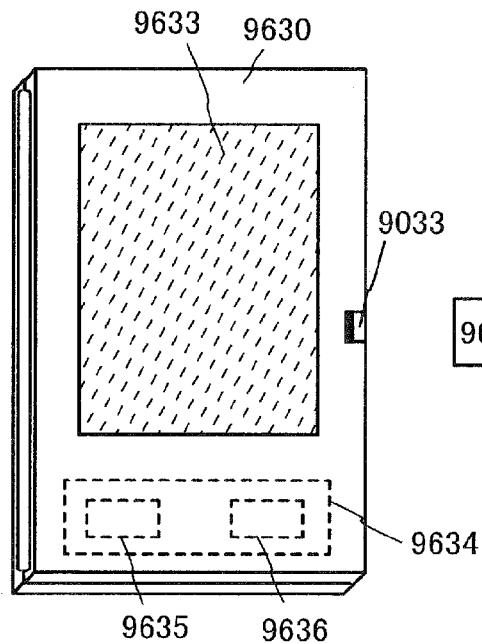
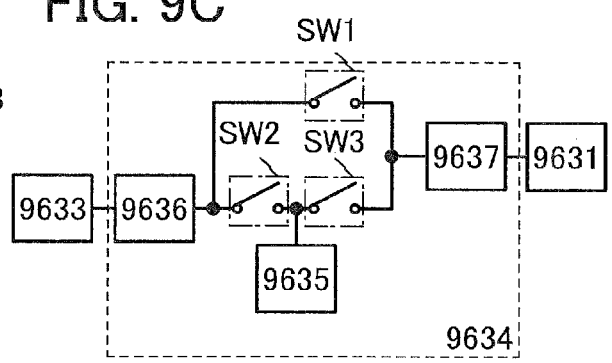

SEMICONDUCTOR DEVICE

BACKGROUND OF THE INVENTION

1. Field of the Invention

The invention disclosed in this specification and the like relates to a semiconductor device and a method for manufacturing the semiconductor device.

In this specification and the like, a semiconductor device refers to all types of devices which can function by utilizing semiconductor characteristics; an electro-optical device, an image display device, a semiconductor circuit, and an electronic device are all semiconductor devices.

2. Description of the Related Art

A technique by which transistors are formed using semiconductor thin films formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique by which a transistor is formed using zinc oxide or an In—Ga—Zn-based oxide semiconductor as an oxide semiconductor is disclosed (see Patent Documents 1 and 2).

Non-Patent Document 1 discloses a transistor including a stack of oxide semiconductors.

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] Arokia Nathan et al., "Amorphous Oxide TFTs: Progress and Issues", SID 2012 Digest, pp. 1-4

SUMMARY OF THE INVENTION

Electrical characteristics of a transistor including an oxide semiconductor vary depending on an interface state between an oxide semiconductor layer and an insulating layer in contact with the oxide semiconductor layer.

For example, interface scattering of carriers at the interface between the oxide semiconductor layer and the insulating layer in contact with the oxide semiconductor layer causes degradation of the field-effect mobility of the transistor. Moreover, if a trap level (also referred to as an interface state) exists at that interface, the trap level causes a change in the electrical characteristics (e.g., the threshold voltage, the subthreshold swing (S value), or the field-effect mobility) of the transistor.

Also, in the structure disclosed in Non-Patent Document 1, the oxide semiconductor functioning as a channel is in contact with a silicon oxide film; thus, silicon, a constituent element of the silicon oxide film, might be mixed into the channel as an impurity. The impurity mixed into the channel causes degradation of the electrical characteristics of the transistor.

Thus, an object of one embodiment of the present invention is to provide high field-effect mobility for a semiconductor device including an oxide semiconductor.

Another object of one embodiment of the present invention is to provide a highly reliable semiconductor device including an oxide semiconductor by preventing a change in its electrical characteristics.

One embodiment of the present invention is a bottom-gate transistor including an oxide semiconductor layer. In the transistor, an oxide semiconductor layer which functions as a current path (channel) of the transistor is sandwiched between oxide semiconductor layers which have lower carrier densities than the oxide semiconductor layer and each function as a buffer layer for stabilizing the interface between the channel and an insulating layer. In such a structure, the channel can be formed away from the interface with the insulating layer in contact with the oxide semiconductor stack, i.e., a buried channel can be formed. Specifically, the following structure can be employed for example. In the specification, the oxide semiconductor stack can be also called an oxide semiconductor stacked layer.

One embodiment of the present invention is a semiconductor device including a gate electrode layer, a gate insulating layer over the gate electrode layer, an oxide semiconductor stack overlapping with the gate electrode layer with the gate insulating layer positioned therebetween, and a source electrode layer and a drain electrode layer electrically connected to the oxide semiconductor stack. The oxide semiconductor stack includes a first oxide semiconductor layer in contact with the gate insulating layer, a second oxide semiconductor layer containing an impurity imparting n-type conductivity and being provided on and in contact with the first oxide semiconductor layer, and a third oxide semiconductor layer on and in contact with the second oxide semiconductor layer.

Another embodiment of the present invention is a semiconductor device including a gate electrode layer, a gate insulating layer over the gate electrode layer, an oxide semiconductor stack overlapping with the gate electrode layer with the gate insulating layer positioned therebetween, and a source electrode layer and a drain electrode layer electrically connected to the oxide semiconductor stack. The oxide semiconductor stack includes a first oxide semiconductor layer in contact with the gate insulating layer, a second oxide semiconductor layer containing an impurity imparting n-type conductivity and being provided on and in contact with the first oxide semiconductor layer, and a third oxide semiconductor layer on and in contact with the second oxide semiconductor layer. The first to third oxide semiconductor layers include a same metal element.

In the above semiconductor device, the first oxide semiconductor layer and the third oxide semiconductor layer are preferably oxide semiconductor layers having lower carrier densities than the second oxide semiconductor layer, further preferably i-type oxide semiconductor layers.

Further, in the above semiconductor device, end portions of the first oxide semiconductor layer, the second oxide semiconductor layer, and the third oxide semiconductor layer may be aligned with each other.

Alternatively, in the above semiconductor device, the third oxide semiconductor layer may be provided so as to cover the first oxide semiconductor layer and the second oxide semiconductor layer.

Effects of a structure of one embodiment of the present invention are described below with reference to FIG. 1. FIG. 1 is an example of an energy band structure of an oxide semiconductor stack, which shows the relation between the bottoms of the conduction band (Ec) and the Fermi level (Ef).

A transistor of one embodiment of the present invention includes an oxide semiconductor stack including a first oxide semiconductor layer S1 in contact with a gate insulating layer, a second oxide semiconductor layer S2 on and in contact with the first oxide semiconductor layer S1, and a third oxide semiconductor layer S3 on and in contact with the second oxide semiconductor layer S2.

In the oxide semiconductor stack, the second oxide semiconductor layer S2 sandwiched between the first oxide semiconductor layer S1 and the third oxide semiconductor layer S3 functions as a channel. The second oxide semiconductor layer S2 is an oxide semiconductor layer containing an impurity imparting n-type conductivity (also referred to as an n-type oxide semiconductor layer). The carrier density of the second oxide semiconductor layer S2 is higher than those of the first oxide semiconductor layer S1 and the third oxide semiconductor layer S3 which have lower concentrations of the impurity than the second oxide semiconductor layer S2. Therefore, the Fermi level (Ef) is closer to the bottom of the conduction band (Ec) in the second oxide semiconductor layer S2 than in the first oxide semiconductor layer S1 and in the third oxide semiconductor layer S3. Consequently, the field-effect mobility of the transistor can be improved.

The first oxide semiconductor layer S1 and the third oxide semiconductor layer S3 are oxide semiconductor layers in which the concentrations of the impurity are lower than that in the second oxide semiconductor layer S2, preferably i-type oxide semiconductor layers.

As shown in FIG. 1, the second oxide semiconductor layer S2 containing the impurity imparting n-type conductivity is sandwiched between the first oxide semiconductor layer S1 and the third oxide semiconductor layer S3 which have lower concentrations of the impurity than the second oxide semiconductor layer S2. In such a structure, the bottom of the conduction band of the second oxide semiconductor layer S2 is lower than those of the first oxide semiconductor layer S1 and the third oxide semiconductor layer S3; thus, conduction band offsets are formed. In this manner, a structure in which carriers flow through a region which is apart from an insulating layer in contact with the oxide semiconductor stack (what is called a buried channel) can be formed. The second oxide semiconductor layer S2 serves as the buried channel, which allows a reduction in interface scattering of carriers. Consequently, high field-effect mobility can be achieved.

In addition, the interface between the channel and the insulating layer in contact with the top layer or the bottom layer of the oxide semiconductor stack can be stabilized, so that the influence of a trap level which might be formed at the channel-side interface or the back-channel-side interface can be reduced. A reduction in the influence of a trap level at the channel-side interface prevents degradation, in particular, photodegradation such as negative-bias temperature stress photodegradation, of the transistor; thus, the transistor can have high reliability. A reduction in the influence of a trap level at the back-channel-side interface enables control of the threshold voltage of the transistor.

The conductivity of the second oxide semiconductor layer S2, which is an n-type oxide semiconductor layer, is higher than those of the first oxide semiconductor layer S1 and the third oxide semiconductor layer S3. Therefore, high field-effect mobility can be achieved in the transistor which includes the n-type second oxide semiconductor layer S2 in the channel.

Note that in the oxide semiconductor stack included in the transistor of one embodiment of the present invention, conduction band offsets are formed by the first oxide semiconductor layer S1 and the third oxide semiconductor layer S3 between which the second oxide semiconductor layer S2 functioning as a channel is sandwiched. The energy band structure is not limited to that in FIG. 1 as long as the bottom of the conduction band of the second oxide semiconductor layer S2 is lower than those of the first oxide semiconductor layer S1 and the third oxide semiconductor layer S3 (i.e., as long as the conduction band energy band structure has a depression). For example, the bottom of the conduction band of the first oxide semiconductor layer Si may be lower than or at the same energy level as that of the third oxide semiconductor layer S3.

An energy difference (built-in potential) between the bottoms of the conduction band in the first oxide semiconductor layer S1 and the second oxide semiconductor layer S2 or between the bottoms of the conduction band in the third oxide semiconductor layer S3 and the second oxide semiconductor layer S2 is preferably greater than or equal to 0.05 eV, further preferably greater than or equal to 0.1 eV.

The impurity imparting n-type conductivity contained in the second oxide semiconductor layer S2 may be boron, nitrogen, phosphorus, or the like. An example of a method for introducing the impurity to obtain the n-type second oxide semiconductor layer S2 is to form the second oxide semiconductor layer S2 by a sputtering method in a mixed atmosphere containing nitrogen or dinitrogen monoxide. Alternatively, the second oxide semiconductor layer S2 may be formed with use of a sputtering target containing boron or phosphorus.

As an oxide semiconductor which is applicable to the first oxide semiconductor layer S1, a material represented by $M1_a M2_b M3_c O_x$ (a is a real number greater than or equal to 0 and less than or equal to 2, b is a real number greater than 0 and less than or equal to 5, c is a real number greater than or equal to 0 and less than or equal to 5, and x is a given real number) can be used. M1 is In, M2 is a metal element such as Ga, Mg, Hf, Al, Sn, or Zr, and M3 is Zn.

As an oxide semiconductor which is applicable to the second oxide semiconductor layer S2, a material represented by $M4_d M5_e M6_f O_x$ (d is a real number greater than 0 and less than or equal to 5, e is a real number greater than or equal to 0 and less than or equal to 3, f is a real number greater than 0 and less than or equal to 5, and x is a given real number) can be used. M4 is In, M5 is a metal element such as Ga, Mg, Hf, Al, Sn, or Zr, and M6 is Zn.

As an oxide semiconductor which is applicable to the third oxide semiconductor layer S3, a material represented by $M7_g M8_h M9_i O_x$ (g is a real number greater than or equal to 0 and less than or equal to 2, h is a real number greater than 0 and less than or equal to 5, i is a real number greater than or equal to 0 and less than or equal to 5, and x is a given real number) can be used. M7 is In, M8 is a metal element such as Ga, Mg, Hf, Al, Sn, or Zr, and M9 is Zn.

Note that at least one of the constituent elements of the first oxide semiconductor layer Si is a metal element which is a constituent element of the second oxide semiconductor layer S2. Further, at least one of the constituent elements of the third oxide semiconductor layer S3 is a metal element which is a constituent element of the second oxide semiconductor layer S2.

According to one embodiment of the present invention, high field-effect mobility can be achieved in a transistor including an oxide semiconductor.

Further, according to one embodiment of the present invention, a change in the electrical characteristics of a transistor including an oxide semiconductor can be prevented, so that a highly reliable semiconductor device can be provided.

BRIEF DESCRIPTION OF THE DRAWINGS

FIGS. 2A to 2C are a plan view and cross-sectional views illustrating one embodiment of a semiconductor device.

FIGS. 5A and 5B each illustrate one embodiment of a semiconductor device.

FIGS. 9A to 9C illustrate an electronic device.

DETAILED DESCRIPTION OF THE INVENTION

Figure 1:
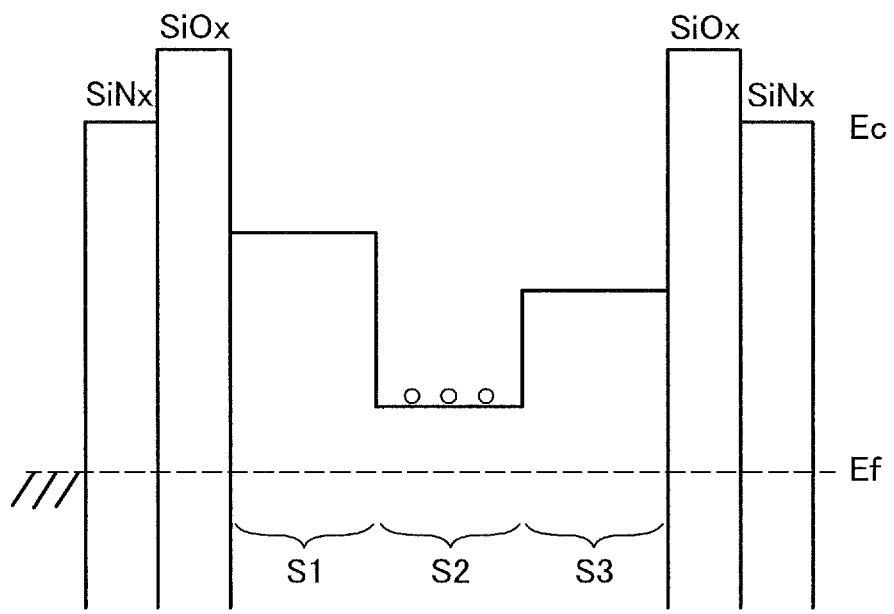
FIG. 1 is a band diagram illustrating one embodiment of an oxide semiconductor stack.

Hereinafter, embodiments of the present invention will be described in detail with reference to the accompanying drawings. Note that the present invention is not limited to the description below and it is easily understood by those skilled in the art that the mode and details can be changed in various ways. Therefore, the invention should not be construed as being limited to the description in the following embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps or the stacking order of layers. In addition, the ordinal numbers in this specification do not denote particular names which specify the present invention.

Embodiment 1

In this embodiment, one embodiment of a semiconductor device and one embodiment of a method for manufacturing the semiconductor device will be described with reference to FIGS. 2A to 2C and FIGS. 3A to 3E. In this embodiment, a bottom-gate transistor including an oxide semiconductor layer is described as an example of the semiconductor device.

FIG. 2A illustrates a structural example of a transistor 310. The transistor 310 in FIG. 2A includes a gate electrode layer 402 provided over a substrate 400 having an insulating surface, a gate insulating layer 404 over the gate electrode layer 402, an oxide semiconductor stack 408 which is in contact with the gate insulating layer 404 and overlaps with the gate electrode layer 402, and a source electrode layer 410a and a drain electrode layer 410b which are electrically connected to the oxide semiconductor stack 408. Further, an insulating layer 412 which covers the source electrode layer 410a and the drain electrode layer 410b and is in contact with the oxide semiconductor stack 408 may be included as a component of the transistor 310. The channel length of the transistor 310 can be, for example, 1 μm or more.

In this embodiment, the gate insulating layer 404 is a stack of a gate insulating layer 404a which is in contact with the gate electrode layer 402 and a gate insulating layer 404b which is in contact with the gate insulating layer 404a and the oxide semiconductor stack 408. Further, the insulating layer 412 is a stack of an insulating layer 412a which is in contact with the source electrode layer 410a and the drain electrode layer 410b and an insulating layer 412b which is over the insulating layer 412a.

In the transistor 310, the oxide semiconductor stack 408 includes a stack of a first oxide semiconductor layer 408a, a second oxide semiconductor layer 408b, and a third oxide semiconductor layer 408c. An oxide semiconductor layer containing an impurity imparting n-type conductivity is used as the second oxide semiconductor layer 408b. Oxide semiconductor layers in which the concentrations of the impurity are lower than that in the second oxide semiconductor layer 408b, preferably i-type (intrinsic) or substantially i-type oxide semiconductor layers are used as the first oxide semiconductor layer 408a and the third oxide semiconductor layer 408c. That is, in the oxide semiconductor stack 408, the second oxide semiconductor layer 408b is sandwiched between the first oxide semiconductor layer 408a and the third oxide semiconductor layer 408c which have lower carrier densities than the second oxide semiconductor layer 408b.

Note that the conductivity of the second oxide semiconductor layer 408b is higher than those of the first oxide semiconductor layer 408a and the third oxide semiconductor layer 408c. When the conductivity of the second oxide semiconductor layer 408b is increased, the distance between the second oxide semiconductor layer 408b and the drain electrode layer 410b (the thickness of the third oxide semiconductor layer 408c) becomes dominant, so that the channel length is shortened in appearance in the forward direction. Thus, the on-state characteristics of the transistor can be improved. In the reverse direction, the third oxide semiconductor layer 408c is depleted; therefore, sufficiently low off-state current can be expected.

In the oxide semiconductor stack 408, an n-type oxide semiconductor layer is used as the second oxide semiconductor layer 408b functioning as a channel, so that the carrier density in the channel can be increased and the Fermi level (Ef) in the energy band diagram can be closer to the conduction band in the second oxide semiconductor layer 408b. Consequently, the field-effect mobility of the transistor can be improved.

An n-type oxide semiconductor layer is used as the second oxide semiconductor layer 408b, and oxide semiconductor layers in which the concentrations of the impurity imparting n-type conductivity are lower than that in the second oxide semiconductor layer 408b, preferably i-type oxide semiconductor layers are used as the first oxide semiconductor layer 408a and the third oxide semiconductor layer 408c between which the second oxide semiconductor layer 408b is sandwiched. In such a structure, a conduction band offset is formed between the second oxide semiconductor layer 408b and the first oxide semiconductor layer 408a or the third oxide semiconductor layer 408c. Thus, a structure in which carriers flow through a region which is apart from the insulating layer (the gate insulating layer 404 and/or the insulating layer 412) in contact with the oxide semiconductor stack 408 (a buried channel) can be formed. The second oxide semiconductor layer 408b serves as the buried channel, which allows a reduction in interface scattering of carriers. Consequently, high field-effect mobility can be achieved.

An energy difference (built-in potential) between the bottoms of the conduction band in the first oxide semiconductor layer 408a and the second oxide semiconductor layer 408b or between the bottoms of the conduction band in the third oxide semiconductor layer 408c and the second oxide semiconductor layer 408b is preferably greater than or equal to 0.05 eV, further preferably greater than or equal to 0.1 eV.

The first oxide semiconductor layer 408a prevents capture of carriers at the interface between the channel and the gate insulating layer, so that photodegradation (e.g., negative-bias temperature stress photodegradation) of the transistor can be reduced, which enables the transistor to have high reliability.

In general, an oxide semiconductor layer is mostly formed by a sputtering method. On the other hand, when the oxide semiconductor layer is formed by sputtering, in some cases, an ionized rare gas element (e.g., argon) or an element ejected from a surface of a sputtering target flicks off a constituent element of a film, such as a gate insulating layer, on which the oxide semiconductor layer is to be formed. The element flicked off from the film on which the oxide semiconductor layer is to be formed might enter the oxide semiconductor layer and function as an impurity element therein. In particular, a portion of the oxide semiconductor layer, which is in the vicinity of the surface on which the oxide semiconductor layer is formed, might have high concentration of the impurity element. Further, when the impurity element remains in the vicinity of the surface where the oxide semiconductor layer is to be formed, the resistance of the oxide semiconductor layer is increased, which causes the electrical characteristics of the transistor to be lowered.

However, in the transistor 310, since the first oxide semiconductor layer 408a is provided between the gate insulating layer 404 and the second oxide semiconductor layer 408b in which the channel is formed, a constituent element of the gate insulating layer 404 can be prevented from diffusing to the channel. That is, the first oxide semiconductor layer 408a may contain the constituent element (e.g., silicon) of the gate insulating layer 404 as an impurity. By including the first oxide semiconductor layer 408a, the transistor 310 can have more stabilized electrical characteristics; thus, a highly reliable semiconductor device can be provided.

The third oxide semiconductor layer 408c provided on the back-channel side of the second oxide semiconductor layer 408b reduces the influence of a trap level at the back-channel-side interface of the transistor 310. Thus, the provision of the third oxide semiconductor layer 408c enables prevention of an increase in S value due to the trap level and/or control of the threshold voltage. When the threshold voltage is controlled with the third oxide semiconductor layer 408c, the transistor can be made normally off.

The thickness of the first oxide semiconductor layer 408a, which reduces the influence of a trap level at the channel-side interface and stabilizes the electrical characteristics of the transistor, can be greater than or equal to 5 nm and less than or equal to 15 nm or greater than or equal to 5 nm and less than or equal to 10 nm, for example. The thickness of the second oxide semiconductor layer 408b functioning as a channel is preferably greater than or equal to 5 nm and less than or equal to 30 nm, further preferably greater than or equal to 5 nm and less than or equal to 20 nm. The thickness of the third oxide semiconductor layer 408c, which reduces the influence of a trap level at the back-channel-side interface and enables control of the threshold voltage, can be greater than or equal to 5 nm and less than or equal to 30 nm or greater than or equal to 5 nm and less than or equal to 20 nm, for example.

For the first to third oxide semiconductor layers 408a to 408c, oxide semiconductors which have different constituent elements or oxide semiconductors which have the same constituent elements but whose compositions are different from each other may be used. Note that it is preferable that an oxide semiconductor which has high field-effect mobility be used for the second oxide semiconductor layer 408b functioning as the channel of the transistor 310.

For example, in the case where the first to third oxide semiconductor layers 408a to 408c are formed using oxide semiconductors which contain indium and gallium, an oxide semiconductor in which the indium content is larger than the gallium content is preferably used for the second oxide semiconductor layer 408b, and oxide semiconductors in which the indium content is lower than or equal to the gallium content are preferably used for the first oxide semiconductor layer 408a and the third oxide semiconductor layer 408c.

In an oxide semiconductor, the s orbital of heavy metal mainly contributes to carrier transfer, and when the percentage of indium in the oxide semiconductor is increased, overlaps of the s orbitals are likely to be increased. Accordingly, when the indium content is higher than the gallium content in the second oxide semiconductor layer 408b, it is possible that the second oxide semiconductor layer 408b has higher field-effect mobility than an oxide in which the indium content is lower than or equal to the gallium content.

Further, as the ratio of the gallium content to the content of the other metal elements) becomes higher in a metal oxide, the energy gap of the metal oxide is increased. Accordingly, when the indium content is lower than or equal to the gallium content in the first oxide semiconductor layer 408a and the third oxide semiconductor layer 408c, the first oxide semiconductor layer 408a and the third oxide semiconductor layer 408c have larger energy gaps than the second oxide semiconductor layer 408b. This structure is preferable because conduction band offsets can be effectively formed between the second oxide semiconductor layer 408b and the first oxide semiconductor layer 408a and between the second oxide semiconductor layer 408b and the third oxide semiconductor layer 408c. Further, gallium needs large formation energy of an oxygen vacancy and thus is not likely to generate an oxygen vacancy as compared to indium. Therefore, a metal oxide in which the indium content is lower than or equal to the gallium content has stable characteristics as compared to a metal oxide in which the indium content is higher than the gallium content. Therefore, the channel-side interface and the back-channel-side interface of the second oxide semiconductor layer 408b can be further stabilized. Note that gallium oxide or zinc gallium oxide may be used for the first oxide semiconductor layer 408a and/or the third oxide semiconductor layer 408c.

For example, in the case where an In—Ga—Zn-based oxide semiconductor is used for the first to third oxide semiconductor layers 408a to 408c, an In—Ga—Zn-based oxide having any of atomic ratios of In:Ga:Zn=1:1:1 (=1/3:1/3:1/3), In:Ga:Zn=1:3:2 (=1/6:3/6:2/6), In:Ga:Zn=2:4:3 (=2/9:4/9:3/9), and In:Ga:Zn=1:5:3 (=1/9:5/9:3/9); or a metal oxide having a composition which is in the neighborhood of any of the above compositions is preferably used for the first oxide semiconductor layer 408a or the third oxide semiconductor layer 408c. For the second oxide semiconductor layer 408b, an In—Ga—Zn-based oxide having any of atomic ratios of In:Ga:Zn=3:1:2 (=3/6:1/6:2/6), In:Ga:Zn=4:2:3 (=4/9:2/9:3/9), In:Ga:Zn=5:1:3 (=5/9:1/9:3/9), In:Ga:Zn=5:3:4 (=5/12:3/12:4/12), In:Ga:Zn=6:2:4 (=6/12:2/12:4/12), and In:Ga:Zn=7:1:3 (=7/11:1/11:3/11); or a metal oxide having a composition which is in the neighborhood of any of the above compositions is preferably used.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05.

The first to third oxide semiconductor layers 408a to 408c have at least one constituent element in common. In this case, depending on materials or deposition conditions of the oxide semiconductor layers, the interfaces between the oxide semiconductor layers are unclear in some cases. Therefore, in FIGS. 2A to 2C, the interfaces between the oxide semiconductor layers are schematically denoted by dotted lines. The same applies to drawings mentioned below.

In this embodiment, an In—Ga—Zn-based oxide having an atomic ratio of In:Ga:Zn=1:3:2 is used as the first oxide semiconductor layer 408a, an In—Ga—Zn-based oxide having an atomic ratio of In:Ga:Zn=3:1:2 is used as the second oxide semiconductor layer 408b, and an In—Ga—Zn-based oxide having an atomic ratio of In:Ga:Zn=1:1:1 is used as the third oxide semiconductor layer 408c.

Note that the oxide semiconductor which is applied to the oxide semiconductor stack 408 is not limited thereto, and an oxide semiconductor with an appropriate composition may be used in accordance with needed electrical characteristics (e.g., field-effect mobility, threshold voltage, and variation). In order to obtain the needed electrical characteristics, the carrier concentration, the impurity concentration, the defect density, the atomic ratio between a metal element and oxygen, the interatomic distance, the density, and the like are preferably set to appropriate values.

For example, as a stabilizer for reducing variation in electrical characteristics of a transistor, one or more of tin (Sn), hafnium (Hf), aluminum (Al), and zirconium (Zr) may be contained instead of gallium (Ga) or in addition to gallium (Ga). As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

The oxide semiconductor layers can be formed by a sputtering method. Generation of particles in deposition can be reduced by using a sputtering target containing indium. Therefore, oxide semiconductor layers containing indium are preferable.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

The first to third oxide semiconductor layers 408a to 408c each may be any one of an amorphous oxide semiconductor layer, a microcrystalline oxide semiconductor layer, and a CAAC-OS film or a mixed film including two or more of these structures, for example. Alternatively, the first to third oxide semiconductor layers 408a to 408c each may be a stacked film including two or more of an amorphous oxide semiconductor layer, a microcrystalline oxide semiconductor layer, and a CAAC-OS film, for example.

When the temperature of a deposition-target substrate is set to be higher than or equal to 200° C., for example, a CAAC-OS film can be obtained.

During deposition, fine sputtered particles fly from a target, and a film is formed such that the sputtered particles adhere onto the deposition-target substrate. When the temperature of the substrate is higher than or equal to 200° C., the sputtered particles are rearranged because the substrate is heated. Thus, a dense film is formed.

An example of a method for manufacturing the transistor 310 is described below with reference to FIGS. 3A to 3E.

First, the gate electrode layer 402 (including a wiring formed with the same layer) is formed over the substrate 400 having an insulating surface.

There is no particular limitation on the substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Furthermore, any of these substrates provided with a semiconductor element may be used as the substrate 400. A base insulating layer may be formed over the substrate 400.

The gate electrode layer 402 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the gate electrode layer 402. The gate electrode layer 402 may have either a single-layer structure or a stacked-layer structure. The gate electrode layer 402 may have a tapered shape with a taper angle of greater than or equal to 15° and less than or equal to 70° for example. Here, the taper angle refers to an angle formed between a side surface of a layer having a tapered shape and a bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode layer 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode layer 402 is formed using any of these materials, the threshold voltage of the transistor can be positive, so that the transistor can be a normally-off switching transistor.

Figure 3A:
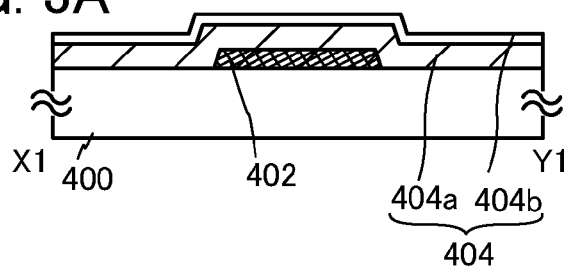
FIGS. 3A to 3E illustrate an example of a method for manufacturing a semiconductor device.

Next, the gate insulating layer 404 is formed so as to cover the gate electrode layer 402 (see FIG. 3A). As the gate insulating layer 404, a single layer or a stack of layers including at least one of the following films formed by a plasma CVD method, a sputtering method, or the like is used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that it is preferable that a region which is included in the gate insulating layer 404 and is in contact with the first oxide semiconductor layer 408a formed later (in this embodiment, the gate insulating layer 404b) be formed using an oxide insulating layer and it is further preferable that the region include an oxygen-excess region. In order to provide the oxygen-excess region in the gate insulating layer 404, for example, the gate insulating layer 404 may be formed in an oxygen atmosphere. Alternatively, oxygen may be introduced into the formed gate insulating layer 404 to provide the oxygen-excess region. Oxygen can be introduced by an ion implantation method, an ion doping method, a plasma immersion ion implantation method, plasma treatment, or the like.

In this embodiment, a silicon nitride film is formed as the gate insulating layer 404a, and a silicon oxide film is formed as the gate insulating layer 404b.

Next, an oxide semiconductor film 407a is formed over the gate insulating layer 404.

The oxide semiconductor film 407a can be formed by a sputtering method, a molecular beam epitaxy (MBE) method, a CVD method, a pulse laser deposition method, an atomic layer deposition (ALD) method, or the like as appropriate.

The gate insulating layer 404 and the oxide semiconductor film 407a are preferably formed in succession without exposure to the air. By forming the gate insulating layer 404 and the oxide semiconductor film 407a in succession without exposure to the air, attachment of hydrogen or a hydrogen compound (e.g., adsorption water) onto a surface of the oxide semiconductor film 407a can be prevented, and thus mixing of an impurity can be prevented.

A sputtering target which is polycrystalline and has a high relative density (a high filling rate) is used as a sputtering target for forming the oxide semiconductor film. The oxide semiconductor film is formed under the following conditions: the sputtering target in deposition is sufficiently cooled to room temperature; the temperature of a surface of a deposition-target substrate where the oxide semiconductor film is to be formed is increased to room temperature or higher; and an atmosphere in a deposition chamber hardly contains moisture or hydrogen.

The higher density of the sputtering target is more preferable. When the density of the sputtering target is increased, the density of a film to be deposited can also be increased. Specifically, the relative density (filling rate) of the sputtering target is set to be higher than or equal to 90% and lower than or equal to 100%, preferably higher than or equal to 95%, more preferably higher than or equal to 99.9%. Note that the relative density of the sputtering target refers to a ratio of the density of the sputtering target to the density of a material free of porosity having the same composition as the sputtering target.

The sputtering target is preferably sintered in an inert gas atmosphere (a nitrogen atmosphere or a rare gas atmosphere), in vacuum, or in a high-pressure atmosphere. As a sintering method, an atmospheric sintering method, a pressure sintering method, or the like can be used as appropriate. A polycrystalline target obtained by any of these methods is used as a sputtering target. A hot pressing method, a hot isostatic pressing (HIP) method, a discharge plasma sintering method, or an impact method is preferably used as a pressure sintering method. The maximum temperature at which sintering is performed is selected depending on the sintering temperature of the sputtering target material, and it is preferably set to approximately 1000° C. to 2000° C., or more preferably, 1200° C. to 1500° C. The holding time of the maximum temperature is selected depending on the sputtering target material, and 0.5 hours to 3 hours is preferable.

In the case of forming an In—Ga—Zn-based oxide film, a target having an atomic ratio of In:Ga:Zn=3:1:2, a target having an atomic ratio of In:Ga:Zn=1:1:1, or the like is used as the sputtering target. For example, in this embodiment, the oxide semiconductor film 407a is formed using a target having an atomic ratio of In:Ga:Zn=1:3:2. An oxide semiconductor film 407b is formed using a target having an atomic ratio of In:Ga:Zn=3:1:2. An oxide semiconductor film 407c is formed using a target having an atomic ratio of In:Ga:Zn=1:1:1.

To obtain a dense film, it is important to reduce impurities which remain in the deposition chamber. The back pressure (ultimate vacuum: degree of vacuum before introduction of a reaction gas) in the deposition chamber is set to be lower than or equal to $5 \times 10^{-3}$ Pa, preferably lower than or equal to $6 \times 10^{-5}$ Pa, and the pressure in deposition is set to be lower than 2 Pa, preferably lower than or equal to 0.4 Pa. When the back pressure is set to be low, impurities in the deposition chamber are reduced.

To obtain a dense film, it is also important to reduce impurities contained in a gas that is introduced into the deposition chamber, i.e., a gas used at the deposition. Further, it is important to increase the proportion of oxygen contained in the deposition gas and optimize power. By increasing the proportion of oxygen (the upper limit: 100% oxygen) in the deposition gas and optimizing the power, plasma damage in deposition can be alleviated. Thus, a dense film is easily obtained.

Deposition of the oxide semiconductor film is preferably performed while a quadrupole mass analyzer (hereinafter also referred to as Q-mass) is operated continuously in order that the amount of moisture in the deposition chamber, or the like is monitored by the Q-mass before or in deposition.

For example, in the case where the oxide semiconductor film 407a is formed by a sputtering method, oxygen or a mixed gas of oxygen and a high-purity rare gas from which impurities such as hydrogen, water, a hydroxyl group, and a hydride have been removed is used as a deposition gas supplied to a deposition chamber of a sputtering apparatus.

Note that heat treatment for dehydration or dehydrogenation may be performed as appropriate on the formed oxide semiconductor film 407a. Further, oxygen may be supplied to the oxide semiconductor film 407a which has been subjected to dehydration or dehydrogenation treatment.

Then, the n-type oxide semiconductor film 407*b* is formed on and in contact with the oxide semiconductor film 407*a*. The formation of the oxide semiconductor film 407*b* is preferably performed in a deposition chamber different from that of the oxide semiconductor film 407*a*. For example, as a deposition gas, the deposition gas mentioned in the description of the oxide semiconductor film 407*a* into which a nitrogen gas or a gas containing nitrogen such as a dinitrogen monoxide gas is mixed is supplied to the deposition chamber; thus, the n-type oxide semiconductor film 407*b* is formed. The other deposition conditions can be similar to those for the oxide semiconductor film 407*a*.

Figure 3B:
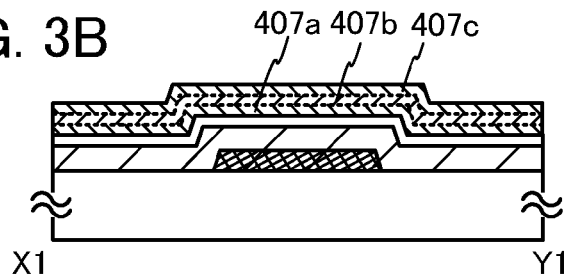

After that, the oxide semiconductor film 407*c* is formed on and in contact with the oxide semiconductor film 407*b* (see FIG. 3B). The oxide semiconductor film 407*c* may be formed in the same deposition chamber as the oxide semiconductor film 407*a*. The deposition conditions for the oxide semiconductor film 407*c* can be similar to those for the oxide semiconductor film 407*a*.

Figure 16:
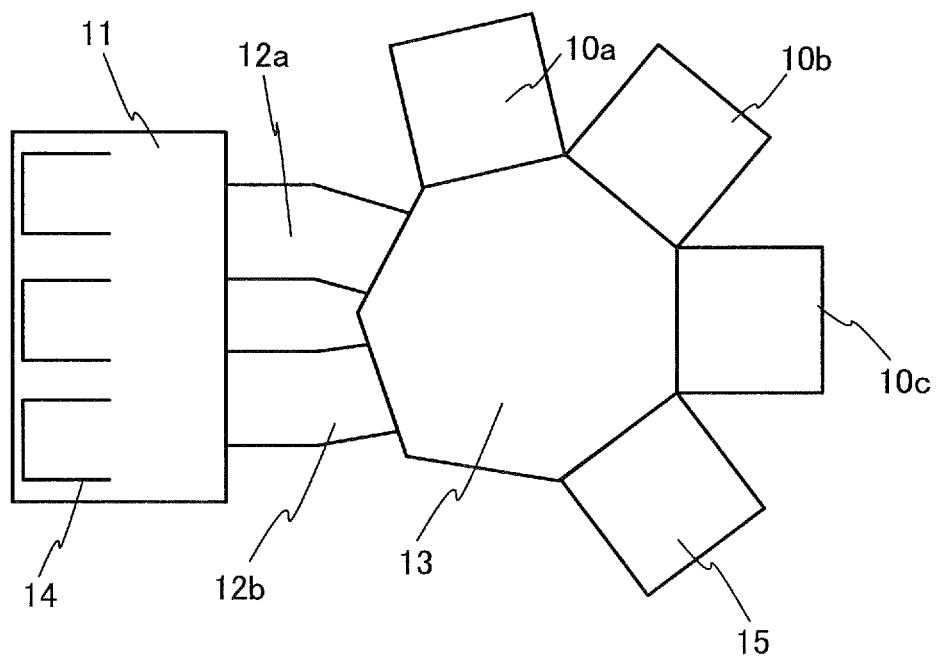
FIG. 16 illustrates a film formation apparatus which can be used for manufacture of a semiconductor device.

In the case of successively stacking the oxide semiconductor film 407*a*, the oxide semiconductor film 407*b*, and the oxide semiconductor film 407*c* in that order without exposure to the air, a manufacturing apparatus whose top view is shown in FIG. 16 may be used.

The manufacturing apparatus illustrated in FIG. 16 is single wafer multi-chamber equipment, which includes three sputtering devices 10*a*, 10*b*, and 10*c*, a substrate supply chamber 11 provided with three cassette ports 14 for holding a process substrate, load lock chambers 12*a* and 12*b*, a transfer chamber 13, a substrate heating chamber 15, and the like. Note that a transfer robot for transferring a process substrate is provided in each of the substrate supply chamber 11 and the transfer chamber 13. Atmospheres of the sputtering devices 10*a*, 10*b*, and 10*c*, the transfer chamber 13, and the substrate heating chamber 15 are preferably controlled so as to hardly contain hydrogen or moisture (i.e., so as to be an inert atmosphere, a reduced pressure atmosphere, a dry air atmosphere, or the like). For example, a preferable atmosphere is a dry nitrogen atmosphere in which the dew point of moisture is −40° C. or lower, preferably −50° C. or lower. An example of a procedure of the manufacturing steps with use of the manufacturing apparatus illustrated in FIG. 16 is as follows. A process substrate is transferred from the substrate supply chamber 11 to the substrate heating chamber 15 through the load lock chamber 12*a* and the transfer chamber 13; moisture attached to the process substrate is removed by vacuum baking or the like in the substrate heating chamber 15; the process substrate is transferred to the sputtering device 10*c* through the transfer chamber 13; and the oxide semiconductor film 407*a* is formed in the sputtering device 10*c*. Then, the process substrate is transferred to the sputtering device 10*a* through the transfer chamber 13 without exposure to the air, and the oxide semiconductor film 407*b* is formed in the sputtering device 10*a*. Then, the process substrate is transferred to the sputtering device 10*b* through the transfer chamber 13 without exposure to the air, and the oxide semiconductor film 407*c* is formed in the sputtering device 10*b*. If necessary, the process substrate is transferred to the substrate heating chamber 15 though the transfer chamber 13 without exposure to the air and subjected to heat treatment. As described above, with use of the manufacturing apparatus illustrated in FIG. 16, a manufacturing process can proceed without the process substrate being exposed to the air.

Figure 3C:
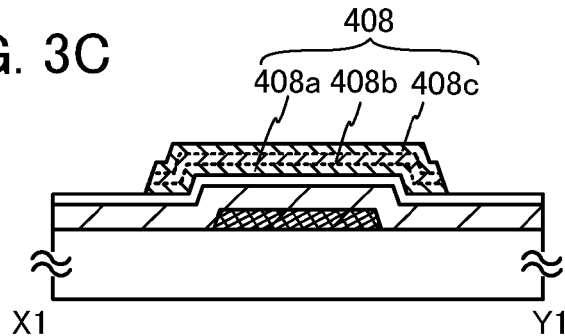

Next, the oxide semiconductor films 407*a* to 407*c* are processed into the first to third oxide semiconductor layers 408*a* to 408*c* having island shapes by etching treatment using a photolithography method, so that the oxide semiconductor stack 408 is formed (see FIG. 3C).

In this embodiment, the oxide semiconductor films 407*a* to 407*c* are processed into island shapes by one etching treatment; thus, end portions of the oxide semiconductor layers included in the oxide semiconductor stack 408 are aligned with each other. Note that in this specification, "aligning with" includes "substantially aligning with". For example, an end portion of a layer A and an end portion of a layer B, which are included in a stacked-layer structure etched using the same mask, are considered to be aligned with each other.

Figure 3D:
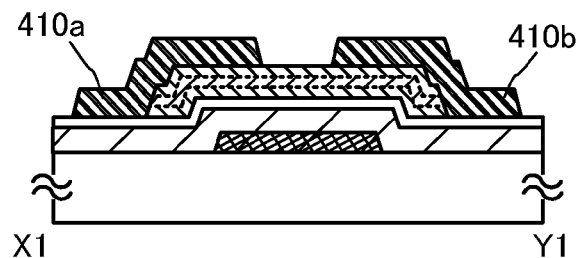

Then, a conductive film is formed over the oxide semiconductor stack 408 and processed to form the source electrode layer 410*a* and the drain electrode layer 410*b* (including a wiring formed with the same layer) (see FIG. 3D).

For the source electrode layer 410*a* and the drain electrode layer 410*b*, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used, for example. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Alternatively, the source electrode layer 410*a* and the drain electrode layer 410*b* may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For the source electrode layer 410*a* and the drain electrode layer 410*b*, a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. These films contain the same constituent elements as the oxide semiconductor stack 408 and can therefore stabilize the interface with the oxide semiconductor stack 408.

Figure 3E:
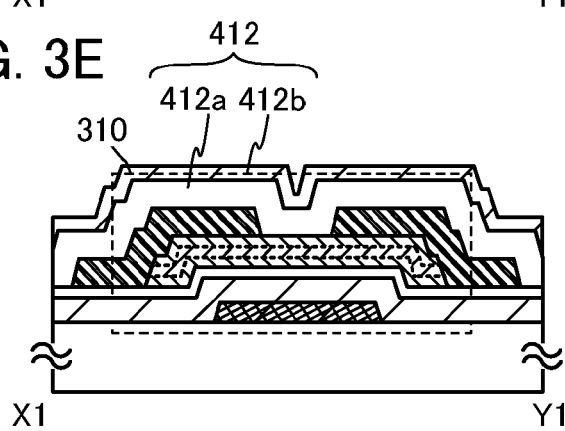

Next, the insulating layer 412 is formed to cover the source electrode layer 410*a*, the drain electrode layer 410*b*, and the exposed oxide semiconductor stack 408 (see FIG. 3E).

The insulating layer 412 can be formed using a single layer or a stack of layers of one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like. Note that it is preferable that an oxide insulating layer be formed as the insulating layer 412 (in this embodiment, the insulating layer 412*a*) in contact with the oxide semiconductor stack 408 because the oxide insulating layer can supply oxygen to the oxide semiconductor stack 408.

For example, a silicon oxide film or a silicon oxynitride film may be formed under the following conditions: the substrate placed in a deposition chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the deposition chamber is greater than or equal to 30 Pa and less than or equal to 250 Pa, preferably greater than or equal to 40 Pa and less than or equal to 200 Pa with introduction of a source gas into the deposition chamber, and high-frequency power is supplied to an electrode provided in the deposition chamber. Under the above conditions, an oxide insulating layer in which oxygen is diffused can be formed.

After the formation of the oxide insulating layer in which oxygen is diffused, a silicon oxide film or a silicon oxynitride film may be formed under the following conditions: the substrate placed in a deposition chamber of the plasma CVD apparatus, which is vacuum-evacuated, without exposure to the air is held at a temperature higher than or equal to 180° C. and lower than or equal to 250° C., preferably higher than or equal to 180° C. and lower than or equal to 230° C., the pressure in the deposition chamber is greater than or equal to 100 Pa and less than or equal to 250 Pa, preferably greater than or equal to 100 Pa and less than or equal to 200 Pa with introduction of a source gas into the deposition chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the deposition chamber. Under the above conditions, the decomposition efficiency of the source gas in plasma is enhanced, oxygen radicals are increased, and oxidation of the source gas is promoted; thus, the oxygen content in the formed silicon oxide film or silicon oxynitride film is in excess of that in the stoichiometric composition. However, the bonding strength of silicon and oxygen is weak in the above substrate temperature range; therefore, part of oxygen is released by heating. Thus, it is possible to form an oxide insulating layer which contains oxygen in a proportion higher than that of oxygen in the stoichiometric composition and from which part of oxygen is released by heating.

In this embodiment, the silicon oxide film in which oxygen is diffused and the silicon oxide film from which part of oxygen is released by heating, which is described above, is formed as the insulating layer 412a, and a silicon nitride film is formed as the insulating layer 412b.

The structure described in this embodiment includes oxide insulating layers (specifically, silicon oxide films) as the insulating layers (the gate insulating layer 404b and the insulating layer 412a) in contact with the oxide semiconductor stack 408. Thus, oxygen can be supplied to the first oxide semiconductor layer 408a and the third oxide semiconductor layer 408c to fill oxygen vacancies in the oxide semiconductor layers. The structure also includes silicon nitride films as the insulating layers (the gate insulating layer 404a and the insulating layer 412b) provided above and below the oxide semiconductor stack 408 to be in contact with the oxide insulating layers. The silicon nitride films can function as barrier films which prevent the entry of hydrogen or a hydrogen compound (e.g., water) into the oxide semiconductor stack 408. Therefore, the reliability of a transistor including such a stacked-layer structure can be improved.

Heat treatment may be performed after the insulating layer 412 is formed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

Through the above steps, the transistor 310 of this embodiment can be formed.

In the transistor described in this embodiment, the second oxide semiconductor layer 408b which functions as a current path (channel) of the transistor is sandwiched between the first oxide semiconductor layer 408a and the third oxide semiconductor layer 408c which have lower carrier densities than the second oxide semiconductor layer 408b. In this structure, the channel can be formed away from the interface with the insulating layer in contact with the oxide semiconductor stack 408, i.e., a buried channel can be formed; thus, the field-effect mobility of the transistor can be improved.

Further, this structure prevents formation of a trap level at the interface of the second oxide semiconductor layer 408b functioning as the channel, and thus enables the transistor to have high reliability.

The structures, methods, and the like described in this embodiment can be combined as appropriate with any of the structures, methods, and the like described in the other embodiments.

Embodiment 2

In this embodiment, one embodiment of a semiconductor device which is different from that in Embodiment 1 will be described with reference to FIGS. 12A and 12B.

Figure 12A:
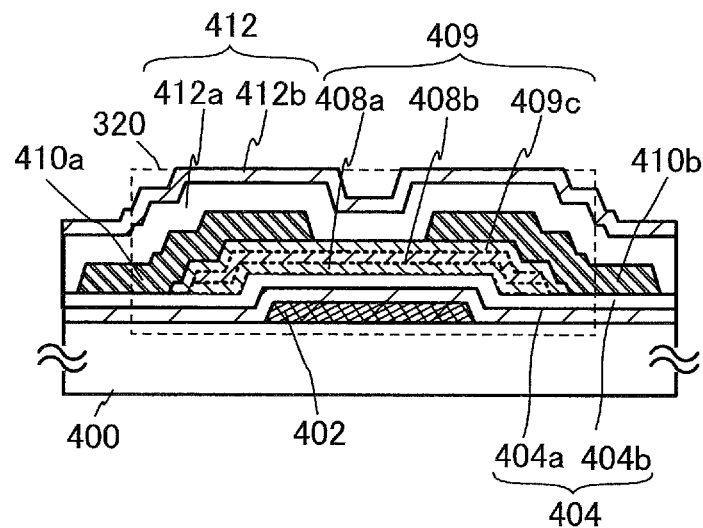
FIGS. 12A and 12B are cross-sectional views each illustrating one embodiment of a semiconductor device.

FIG. 12A illustrates a structural example of a transistor 320. In a manner similar to the transistor 310 in FIGS. 2A to 2C, the transistor 320 in FIG. 12A includes the gate electrode layer 402 provided over the substrate 400 having an insulating surface, the gate insulating layer 404 over the gate electrode layer 402, an oxide semiconductor stack which is in contact with the gate insulating layer 404 and overlaps with the gate electrode layer 402, and the source electrode layer 410a and the drain electrode layer 410b which are electrically connected to the oxide semiconductor stack. Further, the insulating layer 412 which covers the source electrode layer 410a and the drain electrode layer 410b and is in contact with the oxide semiconductor stack may be included as a component of the transistor 320.

An oxide semiconductor stack 409 in the transistor 320 includes the first oxide semiconductor layer 408a in contact with the gate insulating layer 404, the second oxide semiconductor layer 408b on and in contact with the first oxide semiconductor layer 408a, and a third oxide semiconductor layer 409c on and in contact with the second oxide semiconductor layer 408b and in contact with the source electrode layer 410a and the drain electrode layer 410b. The third oxide semiconductor layer 409c is provided so as to cover a side surface of the first oxide semiconductor layer 408a and a side surface of the second oxide semiconductor layer 408b. The periphery of the third oxide semiconductor layer 409c is in contact with the gate insulating layer 404.

Note that the transistor 320 has the same structure as the transistor 310 except the oxide semiconductor stack; therefore, the description of the transistor 310 can be referred to.

A structure of the first oxide semiconductor layer 408a and the second oxide semiconductor layer 408b is similar to that in the transistor 310. The oxide semiconductor stack 409 is formed in the following manner. First, oxide semiconductor films which are to be the first oxide semiconductor layer 408a and the second oxide semiconductor layer 408b are processed into island shapes by etching treatment using a photolithography method, whereby the first oxide semiconductor layer 408a and the second oxide semiconductor layer 408b are formed. Then, an oxide semiconductor film is formed to cover the first oxide semiconductor layer 408a and the second oxide semiconductor layer 408b, and the oxide semiconductor film is processed into an island shape with use of a mask which is different from that used in the processing for forming the first oxide semiconductor layer 408a and the second oxide semiconductor layer 408b, whereby the third oxide semiconductor layer 409c is formed.

In the oxide semiconductor stack 409 illustrated in FIG. 12A, the side surface of the second oxide semiconductor layer 408b functioning as a channel is covered with the third oxide semiconductor layer 409c so as not to be in contact with the source electrode layer 410a or the drain electrode layer 410b. Such a structure can reduce generation of leakage current between the source electrode layer 410a and the drain electrode layer 410b of the transistor.

Figure 12B:
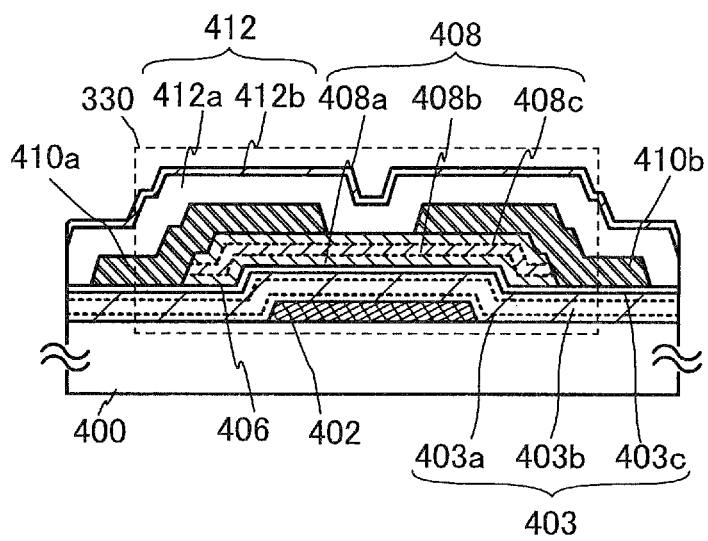

FIG. 12B illustrates a structural example of a transistor 330. In a manner similar to the transistor 310 in FIGS. 2A to 2C, the transistor 330 in FIG. 12B includes the gate electrode layer 402 provided over the substrate 400 having an insulating surface, the gate insulating layer over the gate electrode layer 402, the oxide semiconductor stack 408 which is in contact with the gate insulating layer and overlaps with the gate electrode layer 402, and the source electrode layer 410a and the drain electrode layer 410b which are electrically connected to the oxide semiconductor stack 408. In the transistor 330, the oxide semiconductor stack 408 includes the first oxide semiconductor layer 408a in contact with the gate insulating layer 404, the second oxide semiconductor layer 408b on and in contact with the first oxide semiconductor layer 408a, and the third oxide semiconductor layer 408c on and in contact with the second oxide semiconductor layer 408b and in contact with the source electrode layer 410a and the drain electrode layer 410b. Further, the insulating layer 412 which covers the source electrode layer 410a and the drain electrode layer 410b and is in contact with the oxide semiconductor stack 408 may be included as a component of the transistor 330.

The transistor 330 is different from the transistor 310 in that the gate insulating layer has a structure in which a first gate insulating layer 403 which includes gate insulating layers 403a, 403b, and 403c, and a second gate insulating layer 406 are stacked from the gate electrode layer 402 side.

Note that the transistor 330 has the same structure as the transistor 310 except the gate insulating layer; therefore, the description of the transistor 310 can be referred to.

In the transistor 330, a nitrogen-containing silicon film is applied to the first gate insulating layer 403. A nitrogen-containing silicon film has higher relative permittivity than a silicon oxide film and needs to have a larger thickness than a silicon oxide film to obtain the same electrostatic capacity; thus, it is possible to physically increase the thickness of the gate insulating layer. Accordingly, a reduction in withstand voltage of the transistor 330 is prevented and further the withstand voltage is improved, so that electrostatic breakdown of the semiconductor device can be prevented.

Further, as the second gate insulating layer 406 in contact with the first oxide semiconductor layer 408a, an insulating layer containing oxygen, such as a silicon oxide film, a gallium oxide film, or an aluminum oxide film, is used. It is further preferable that the second gate insulating layer 406 include a region which contains oxygen in a proportion higher than that of oxygen in the stoichiometric composition (i.e., an oxygen-excess region). This is because when the insulating layer in contact with the first oxide semiconductor layer 408a includes an oxygen-excess region, oxygen can be supplied to the first oxide semiconductor layer 408a and thus oxygen can be prevented from being released from the first oxide semiconductor layer 408a, and oxygen vacancies in the first oxide semiconductor layer 408a can be filled. In order to provide the oxygen-excess region in the second gate insulating layer 406, the second gate insulating layer 406 is formed in an oxygen atmosphere, for example. Alternatively, oxygen may be introduced into the formed second gate insulating layer 406 to provide the oxygen-excess region.

A silicon nitride film, a silicon nitride oxide film, and a silicon oxynitride film can be given as examples of the nitrogen-containing silicon film which is applied to the first gate insulating layer 403. As the ratio of the nitrogen content to the oxygen content becomes higher, relative permittivity is increased; thus, a silicon nitride film is preferably used. Further, the energy gap of silicon nitride is as small as 5.5 eV whereas the energy gap of silicon oxide is 8 eV, and the specific resistance of silicon nitride is small accordingly; therefore, use of a silicon nitride film can lead to high electrostatic discharge (ESD) resistance. Note that in this specification, a "silicon oxynitride film" refers to a film that includes more oxygen than nitrogen, and a "silicon nitride oxide film" refers to a film that includes more nitrogen than oxygen.

The gate insulating layer 403a in contact with the gate electrode layer 402 is a silicon film which contains a smaller amount of ammonia than at least the gate insulating layer 403b. Ammonia serves as a ligand of a metal complex owing to a function of a lone electron-pair on a nitrogen atom. Thus, in the case where copper is used for the gate electrode layer 402, for example, and a gate insulating layer containing a large amount of ammonia is provided in contact with the gate electrode layer, an ammonium group and the copper might form a complex so that the copper might be diffused into the gate insulating layer.

When the gate insulating layer 403a containing a small amount of ammonia (a smaller amount ammonia than at least the gate insulating layer 403b) is provided in contact with the gate electrode layer 402 in the transistor 330, a material (e.g., copper) of the gate electrode layer 402 can be prevented from diffusing into the first gate insulating layer 403. In other words, the gate insulating layer 403a can function as a barrier film against a metal material included in the gate electrode layer 402. By including the gate insulating layer 403a, the transistor can have higher reliability.

As the gate insulating layer 403b, a nitrogen-containing silicon film which has a larger thickness than the gate insulating layer 403a and in which the number of defects is reduced is used. For example, the gate insulating layer 403b has a thickness greater than or equal to 300 nm and less than or equal to 400 nm. As described above, by providing a nitrogen-containing silicon film having a large thickness (e.g., 300 nm or more) in which the number of defects is reduced, it is possible that the gate insulating layer 403b has an ESD resistance of 300 V or more, for example.

As the gate insulating layer 403c, a nitrogen-containing silicon film in which the hydrogen concentration is reduced is used. The hydrogen concentration in the gate insulating layer 403c is lower than at least that in the gate insulating layer 403b. For example, in the case where the gate insulating layer 403c is formed by a plasma CVD method, the concentration of hydrogen contained in a supply gas is reduced to lower than the hydrogen concentration in a supply gas used for forming the gate insulating layer 403b, whereby the hydrogen concentration in the gate insulating layer 403c can be made lower than that in gate insulating layer 403b. Specifically, in the case where silicon nitride films are formed as the gate insulating layer 403b and the gate insulating layer 403c, the gate insulating layer 403c may be formed using a supply gas containing a smaller amount of ammonia than a supply gas for forming the gate insulating layer 403b or may be formed without using ammonia.

When a silicon nitride film in which the hydrogen concentration is reduced is provided as the gate insulating layer 403c, the amount of hydrogen or a hydrogen compound (e.g., water) which is mixed into the second gate insulating layer 406 and the oxide semiconductor stack 408 can be reduced. Hydrogen generates electrons serving as carriers, which causes the threshold voltage of the transistor to be changed (shifted) in the negative direction. Accordingly, by including a silicon nitride film in which the hydrogen concentration is reduced as the gate insulating layer 403c, the transistor can have stabilized electrical characteristics. Further, by being provided as the gate insulating layer 403c, the silicon nitride film in which the hydrogen concentration is reduced has an effect as a barrier film for preventing impurities such as hydrogen and a hydrogen compound included in the gate insulating layer 403b from diffusing into the oxide semiconductor stack 408.

In this embodiment, silicon nitride films are used as the gate insulating layer 403a, the gate insulating layer 403b, and the gate insulating layer 403c which are included in the first gate insulating layer 403; and a silicon oxynitride film is used as the second gate insulating layer 406. The gate insulating layers are formed successively by a plasma CVD method. Specifically, a mixed gas of silane ($SiH_4$) and nitrogen ($N_2$) is supplied and a silicon nitride film to be the gate insulating layer 403a is formed; the supply gas is switched to a mixed gas of silane ($SiH_4$), nitrogen ($N_2$), and ammonia ($NH_3$) and a silicon nitride film to be the gate insulating layer 403b is formed; then the supply gas is switched to a mixed gas of silane ($SiH_4$) and nitrogen ($N_2$) and a silicon nitride film to be the gate insulating layer 403c is formed; and then the supply gas is switched to a mixed gas of silane ($SiH_4$) and dinitrogen monoxide ($N_2O$) and a silicon oxynitride film to be the second gate insulating layer 406 is formed.

The gate insulating layer 403a preferably has a thickness greater than or equal to 30 nm and less than or equal to 100 nm and further preferably has a thickness greater than or equal to 30 nm and less than or equal to 50 nm The gate insulating layer 403b, which is provided as a countermeasure against electrostatic breakdown of the transistor, preferably has a thickness greater than or equal to 300 nm and less than or equal to 400 nm The gate insulating layer 403c, which functions as a barrier film for preventing diffusion of hydrogen into the oxide semiconductor stack 408, preferably has a thickness greater than or equal to 25 nm and less than or equal to 150 nm. The second gate insulating layer 406 preferably has a thickness greater than or equal to 25 nm and less than or equal to 100 nm. Note that the thickness of each of the gate insulating layers is preferably adjusted so that the total of the thickness of the first gate insulating layer 403 (the total thickness of the gate insulating layer 403a, the gate insulating layer 403b, and the gate insulating layer 403c) and the thickness of the second gate insulating layer 406 is greater than or equal to 355 nm and less than or equal to 550 nm.

The transistor 330 has, as the gate insulating layer, a stacked structure which is formed of a first gate insulating layer including a nitrogen-containing silicon film functioning as a barrier film against a constituent element (e.g., copper) of a gate electrode layer, a nitrogen-containing silicon film having a large thickness (e.g., 300 nm) in which the number of defects is reduced, and a nitrogen-containing silicon film having a blocking property against hydrogen; and a second gate insulating layer containing oxygen. Accordingly, in the transistor 330, variations in the electrical characteristics and electrostatic breakdown are prevented. By including such a transistor, a semiconductor device can have high reliability, and the semiconductor device can be provided with high yield.

The structures, methods, and the like described in this embodiment can be combined as appropriate with any of the structures, methods, and the like described in the other embodiments.

Embodiment 3

In this embodiment, a CAAC-OS film which can be used as an oxide semiconductor layer will be described. Specifically, a phenomenon which occurs during formation of a CAAC-OS film is described in detail with reference to FIGS. 13A to 13C, FIGS. 14A and 14B, and FIGS. 15A to 15C.

As described above, during deposition, fine sputtered particles fly from a target, and a film is formed such that the sputtered particles adhere onto the deposition-target substrate. When the temperature of the substrate is higher than or equal to 200° C., the sputtered particles are rearranged because the substrate is heated. Thus, a dense film is formed.

Figure 13A:
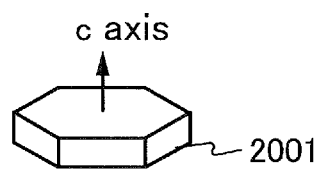
FIG. 13A is a schematic view of a flat-plate-like sputtered particle.
Figure 13B:
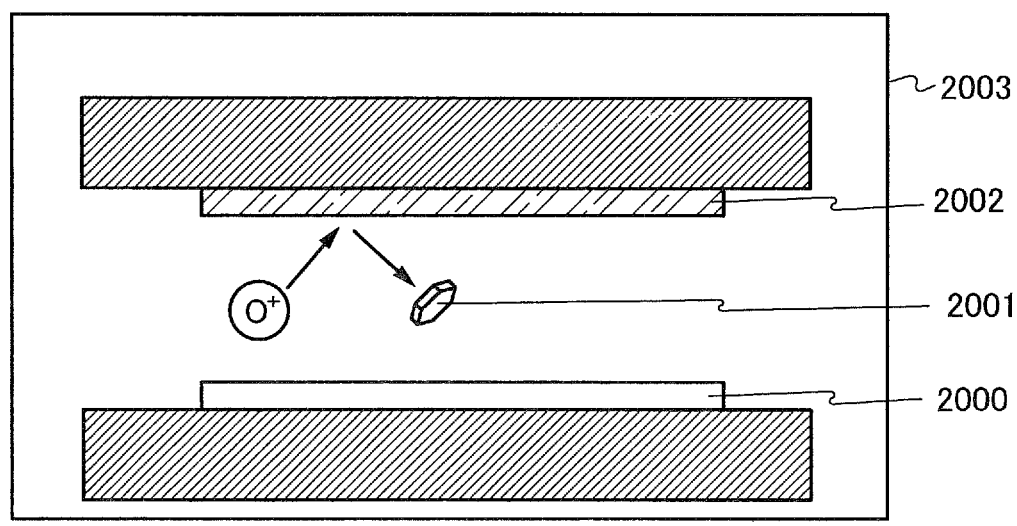
FIG. 13B illustrates a model of film formation.
Figure 13C:
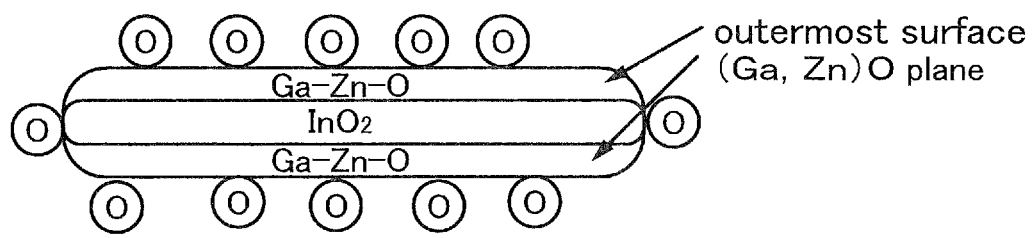
FIG. 13C is a model diagram illustrating a state of a flat-plate-like sputtered particle.

When ions collide with the surface of the sputtering target, a crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. On the assumption that a crystal particle which is sputtered from the surface of a sputtering target 2002 and released is a flat-plate-like sputtered particle 2001 having c-axis alignment as illustrated in FIG. 13A, film formation can be schematically illustrated by a model diagram in FIG. 13B. The outermost surface of the flat-plate-like sputtered particle is preferably a (Ga or Zn)O plane as illustrated in FIG. 13C.

Figure 14A:
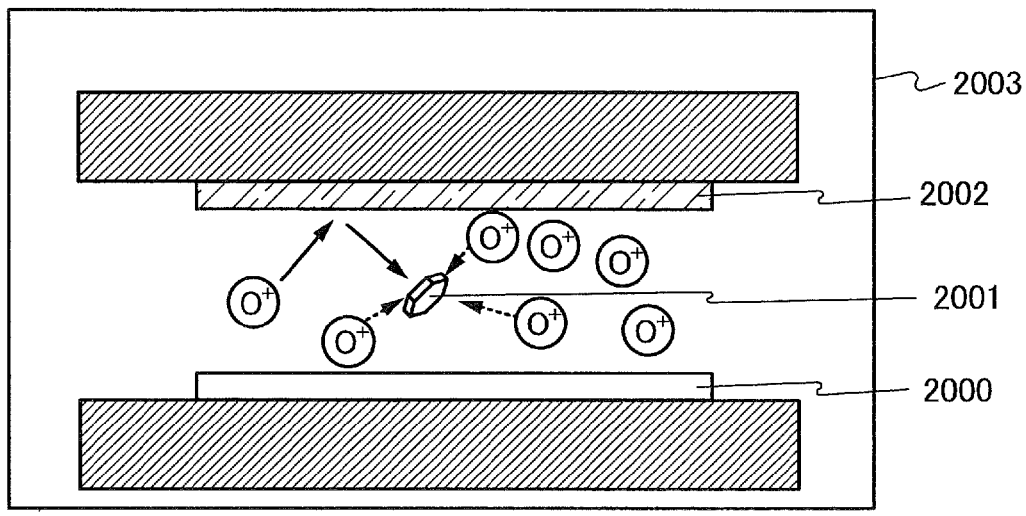
FIG. 14A illustrates a model of film formation.

In film formation, when the oxygen flow rate is high and the pressure inside a chamber 2003 is high, oxygen ions are attached to the flat-plate-like sputtered particle as illustrated in FIG. 14A, so that the flat-plate-like sputtered particle can have much oxygen on its surface. Another flat-plate-like sputtered particle is stacked thereover before the attached oxygen is released; thus, much oxygen can be contained in the film as illustrated in FIG. 15C. This adsorbed oxygen contributes to a reduction in oxygen vacancies in the oxide semiconductor.

Figure 14B:
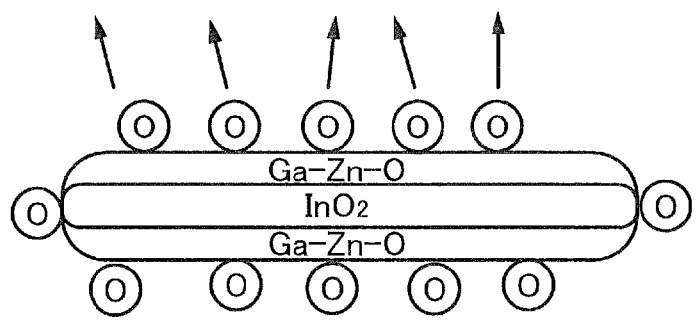
FIG. 14B is a model diagram illustrating a state where oxygen is released from a flat-plate-like sputtered particle.

To form an oxide semiconductor film including a crystal region with c-axis alignment, the substrate temperature in film formation is preferably increased. However, when the substrate temperature is higher than 350° C., the adsorbed oxygen might be released as illustrated in FIG. 14B. Accordingly, the substrate temperature is set to be higher than or equal to 150° C. and lower than or equal to 350° C., preferably higher than or equal to 160° C. and lower than or equal to 230° C., and an oxygen gas is used alone as the deposition gas, whereby an oxide semiconductor film including a crystal region with c-axis alignment, i.e., a CAAC-OS film can be formed.

Figure 15A:
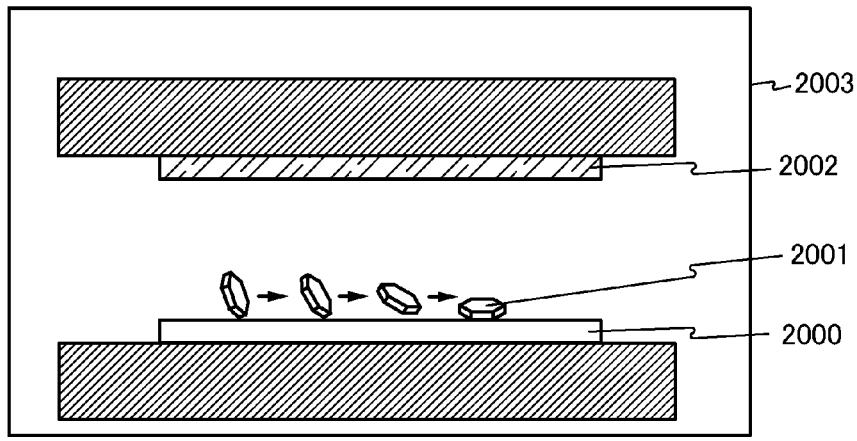
FIGS. 15A and 15B illustrate a model of film formation.
Figure 15B:
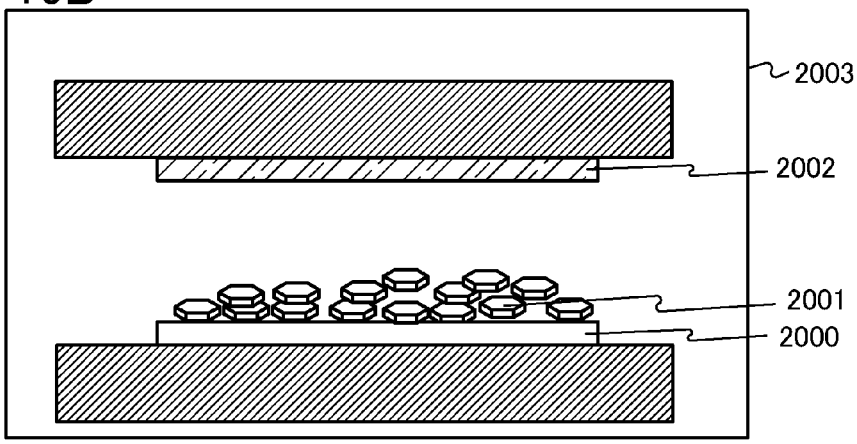
Figure 15C:
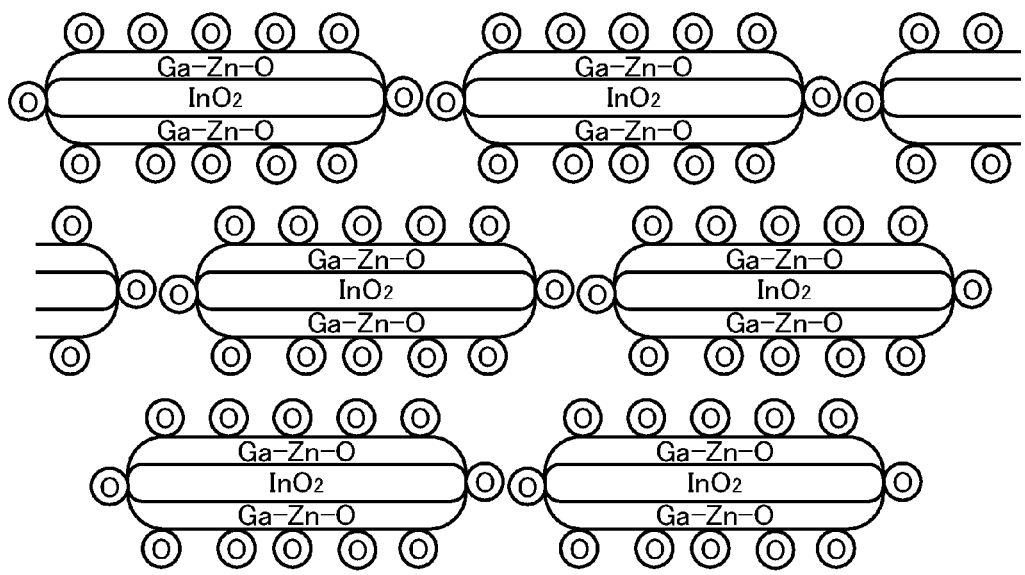
FIG. 15C is a model diagram illustrating a state of flat-plate-like sputtered particles.

FIG. 15A illustrates a supposed model of a process in which one flat-plate-like sputtered particle reaches the surface of a substrate 2000 and is stabilized in film formation. As illustrated in FIG. 15A, the flat-plate-like sputtered particle reaches the substrate surface with its crystalline state maintained; thus, a CAAC-OS film is likely to be formed. Further, flat-plate-like sputtered particles are stacked as illustrated in FIG. 15B; thus, a CAAC-OS film is likely to be formed. Note that a CAAC-OS film is a film which contains much oxygen as illustrated in FIG. 15C and in which oxygen vacancies are reduced.

In the CAAC-OS film over the substrate 2000, a series of about 2 to 20 indium atoms exist in a lateral direction to form a layer including indium atoms. Note that in some cases, the layer has a series of 20 or more indium atoms; for example, the layer may have a series of 2 to 50 indium atoms, 2 to 100 indium atoms, or 2 to 500 indium atoms in a lateral direction.

Layers including indium atoms overlap with each other. The number of layers is greater than or equal to 1 and less than or equal to 20, greater than or equal to 1 and less than or equal to 10, or greater than or equal to 1 and less than or equal to 4.

As described above, a stack of the layers including indium atoms often appears to be a cluster including several indium atoms in a lateral direction and several layers in a longitudinal direction. This is because each of the sputtered particles has a flat-plate-like shape.

By increasing the temperature of the deposition-target substrate, migration of sputtered particles is likely to occur on a substrate surface. With this effect, a flat-plate-like sputtered particle reaches the substrate surface, moves slightly, and then is attached to the substrate surface with a flat plane (a-b plane) of the sputtered particle facing toward the substrate surface. Therefore, an oxide semiconductor film having a crystal region which is c-axis-aligned perpendicularly to the surface of the oxide semiconductor film is easily formed.

Further, heat treatment at a temperature higher than or equal to 200° C. may be performed after the deposition of the oxide semiconductor film, so that a denser film is obtained. However, in that case, oxygen vacancies might be generated when impurity elements (e.g., hydrogen and water) in the oxide semiconductor film are reduced. Therefore, before the heat treatment is performed, an insulating layer containing excess oxygen is preferably provided over or below the oxide semiconductor film, in which case oxygen vacancies in the oxide semiconductor film can be reduced by the heat treatment.

An oxide semiconductor film shortly after deposition is made dense; thus, a dense film which is thin and close to single crystal can be obtained. Since oxygen, hydrogen, or the like hardly diffuses within the film, a semiconductor device including the dense oxide semiconductor film can achieve improvement in reliability.

In an oxide semiconductor stack included in a transistor of one embodiment of the present invention, first to third oxide semiconductor layers may have either an amorphous structure or a crystalline structure. Note that a CAAC-OS film is preferably used as the second oxide semiconductor layer functioning as a channel, in which case the density of states (DOS) attributed to an oxygen vacancy in the second oxide semiconductor layer can be reduced.

In the case where the second oxide semiconductor layer and the third oxide semiconductor layer which is formed on and in contact with the second oxide semiconductor layer are both CAAC-OS films, the crystal structure is preferably continuous between the second oxide semiconductor layer and the third oxide semiconductor layer. When the third oxide semiconductor layer is continuous with the second oxide semiconductor layer in terms of crystal structure, DOS is less likely to be formed at the interface between the two layers.

All the first to third oxide semiconductor layers may be CAAC-OS films. Note that, as described above, the first oxide semiconductor layer in contact with the gate insulating layer might contain a constituent element of the gate insulating layer as an impurity, in which case its crystallinity is lowered. Alternatively, all the first to third oxide semiconductor layers may have an amorphous structure.

The oxide semiconductor film described in this embodiment can be applied to the semiconductor device in Embodiment 1 or Embodiment 2.

Embodiment 4

A semiconductor device having a display function (also referred to as a display device) can be manufactured using the transistor described in Embodiment 1 or Embodiment 2. Further, part or all of the driver circuitry which includes the transistor can be formed over a substrate where a pixel portion is formed, whereby a system-on-panel can be formed.

Figure 4A:
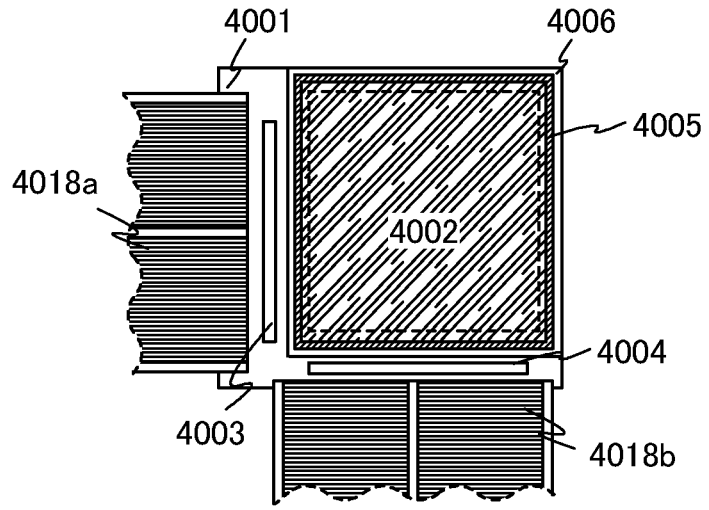
FIGS. 4A to 4C each illustrate one embodiment of a semiconductor device.

In FIG. 4A, a sealant 4005 is provided so as to surround a pixel portion 4002 provided over a substrate 4001, and the pixel portion 4002 is sealed with a substrate 4006. In FIG. 4A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. Various signals and potentials are supplied to the pixel portion 4002 through the signal line driver circuit 4003 and the scan line driver circuit 4004 from flexible printed circuits (FPCs) 4018a and 4018b.

Figure 4B:
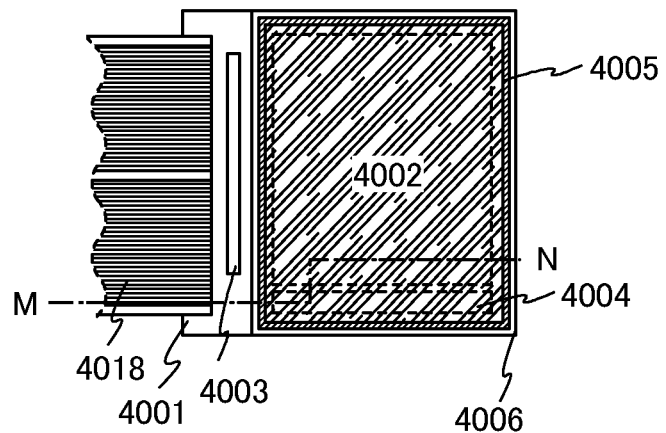
Figure 4C:
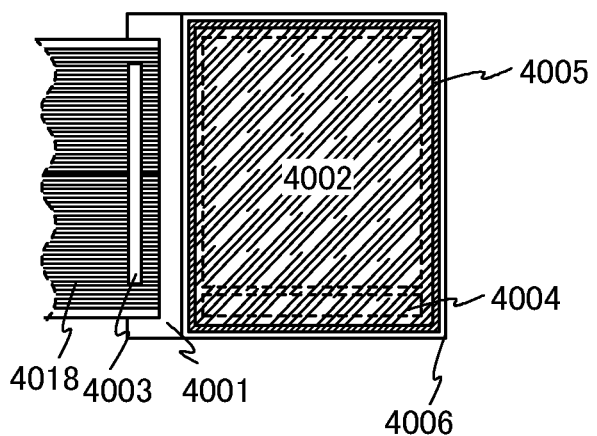

In FIGS. 4B and 4C, the sealant 4005 is provided to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 4B and 4C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 4B and 4C, various signals and potentials are supplied to the pixel portion 4002 through the signal line driver circuit 4003 and the scan line driver circuit 4004 from an FPC 4018.

Although FIGS. 4B and 4C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 4A shows an example in which the signal line driver circuit 4003 and the scan line driver circuit 4004 are mounted by a COG method. FIG. 4B shows an example in which the signal line driver circuit 4003 is mounted by a COG method.

FIG. 4C shows an example in which the signal line driver circuit 4003 is mounted by a TAB method.

Note that the display device includes in its category a panel in which the display element is sealed, and a module in which an IC including a controller or the like is mounted on the panel. Specifically, a display device in this specification means an image display device, a display device, or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in Embodiment 1 or Embodiment 2 can be applied thereto.

As the display element provided in the display device, a liquid crystal element (also referred to as a liquid crystal display element) or a light-emitting element (also referred to as a light-emitting display element) can be used. The light-emitting element, in its category, an element whose luminance is controlled by current or voltage, and specifically includes an inorganic electroluminescent (EL) element, an organic EL element, and the like. Furthermore, a display medium whose contrast is changed by an electric effect, such as an electronic ink display device (electronic paper), can be used.

Embodiments of the semiconductor device are described with reference to FIGS. 4A to 4C and FIGS. 5A and 5B. FIGS. 5A and 5B correspond to cross-sectional views along line M-N in FIG. 4B. Examples of a liquid crystal display device using a liquid crystal element as a display element are illustrated in FIGS. 5A and 5B.

A liquid crystal display device can employ a vertical electric field mode or a horizontal electric field mode. FIG. 5A illustrates an example in which a vertical electric field mode is employed, and FIG. 5B illustrates and example in which a fringe field switching (FFS) mode, which is one of horizontal electric field modes, is employed.

Note that a transistor 4010 provided in the pixel portion 4002 is electrically connected to a display element to form a display panel. A variety of display elements can be used as the display element as long as display can be performed.

As illustrated in FIGS. 4A to 4C and FIGS. 5A and 5B, the semiconductor device includes a connection terminal electrode 4015 and a terminal electrode 4016. The connection terminal electrode 4015 and the terminal electrode 4016 are electrically connected to a terminal included in the FPC 4018 or FPC 4018b through an anisotropic conductive layer 4019.

The connection terminal electrode 4015 is formed from the same conductive layer as a first electrode layer 4034. The terminal electrode 4016 is formed from the same conductive layer as a source electrode layer and a drain electrode layer of the transistor 4010 and a transistor 4011.

The pixel portion 4002 and the scan line driver circuit 4004 provided over the substrate 4001 include a plurality of transistors. FIGS. 5A and 5B illustrate the transistor 4010 included in the pixel portion 4002 and the transistor 4011 included in the scan line driver circuit 4004. In FIGS. 5A and 5B, an insulating layer 4032 is provided over the transistors 4010 and 4011.

In FIG. 5B, a planarization insulating layer 4040 is provided over the insulating layer 4032, and an insulating layer 4042 is provided between the first electrode layer 4034 and the second electrode layer 4031.

The transistor described in Embodiment 1 or Embodiment 2 can be applied to the transistor 4010 and the transistor 4011. In this embodiment, an example in which a transistor having a structure similar to that of the transistor 310 described in Embodiment 1 is used is described. The transistors 4010 and 4011 are bottom-gate transistors.

In each of the transistors 4010 and 4011, a second oxide semiconductor layer which functions as a current path (channel) is sandwiched between a first oxide semiconductor layer and a third oxide semiconductor layer which have lower carrier densities than the second oxide semiconductor layer. Accordingly, each of the transistors 4010 and 4011 is a buried-channel transistor in which a current path is formed away from the interface with the insulating layer, and therefore has high field-effect mobility. In addition, each of the transistors 4010 and 4011 is a highly reliable transistor in which influence of an interface state which might be formed on the back channel side is reduced and photodegradation (e.g., negative-bias temperature stress photodegradation) is reduced.

Moreover, a conductive layer may be provided so as to overlap with a channel formation region in the oxide semiconductor layer of the transistor 4011 for the driver circuit. When the conductive layer is provided so as to overlap with the channel formation region in the oxide semiconductor layer, the amount of change in the threshold voltage of the transistor 4011 can be further reduced. The conductive layer may have the same potential as or a potential different from that of a gate electrode layer of the transistor 4011, and can function as a second gate electrode layer. The potential of the conductive layer may be in a floating state, for example.

In addition, the conductive layer has a function of blocking an external electric field, that is, a function of preventing an external electric field (particularly, a function of preventing static electricity) from affecting the inside (a circuit portion including a transistor). A blocking function of the conductive layer can prevent variation in the electrical characteristics of the transistor due to an influence of an external electric field such as static electricity.

In FIGS. 5A and 5B, a liquid crystal element 4013 includes a first electrode layer 4034, a second electrode layer 4031, and a liquid crystal layer 4008. Note that insulating layers 4033 and 4038 functioning as alignment films are provided so that the liquid crystal layer 4008 is positioned therebetween.

In FIG. 5A, the second electrode layer 4031 is provided on the substrate 4006 side, and the first electrode layer 4034 and the second electrode layer 4031 are stacked with the liquid crystal layer 4008 provided therebetween. In FIG. 5B, the second electrode layer 4031 having an opening pattern is provided below the liquid crystal layer 4008, and the first electrode layer 4034 having a flat plate shape is provided below the second electrode layer 4031 with the insulating layer 4042 provided therebetween. In FIG. 5B, the second electrode layer 4031 having an opening pattern includes a bent portion or a comb-shaped portion. An arrangement of the first electrode layer 4034 and the second electrode layer 4031, which complies with both conditions that they have the same shape and they completely overlap with each other, is avoided in order to generate an electric field between the electrodes. Note that a structure may be employed in which the second electrode layer 4031 having a flat plate shape is formed on and in contact with the planarization insulating layer 4040, and the first electrode layer 4034 having an opening pattern and serving as a pixel electrode is formed over the second electrode layer 4031 with the insulating layer 4042 provided therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4034 and the second electrode layer 4031. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

A spacer 4035 is a columnar spacer obtained by selective etching of an insulating layer and is provided in order to control the thickness of the liquid crystal layer 4008 (a cell gap). Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystal materials may be a low molecular compound or a high molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electric signal such as an image signal can be held for a longer period and a writing interval can be set longer. Accordingly, the frequency of refresh operation can be reduced, which leads to an effect of suppressing power consumption.

The transistor including an oxide semiconductor layer, which is disclosed in this specification, can have high field-effect mobility; thus, the transistor can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively).

For example, R, G, B, and W (W corresponds to white); R, G, B, and one or more of yellow, cyan, magenta, and the like; or the like can be used. Further, the sizes of display regions may be different between respective dots of color elements. Note that one embodiment of the disclosed invention is not limited to the application to a display device for color display; the disclosed invention can also be applied to a display device for monochrome display.

Figure 10A:
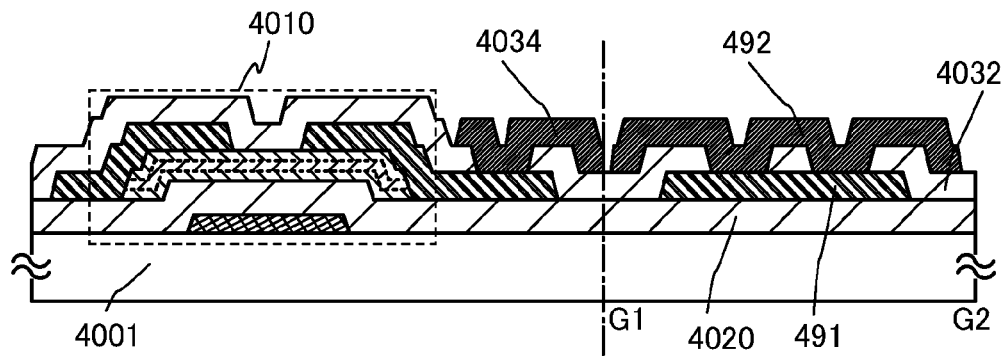
FIGS. 10A to 10C illustrate one embodiment of a semiconductor device.
Figure 10B:
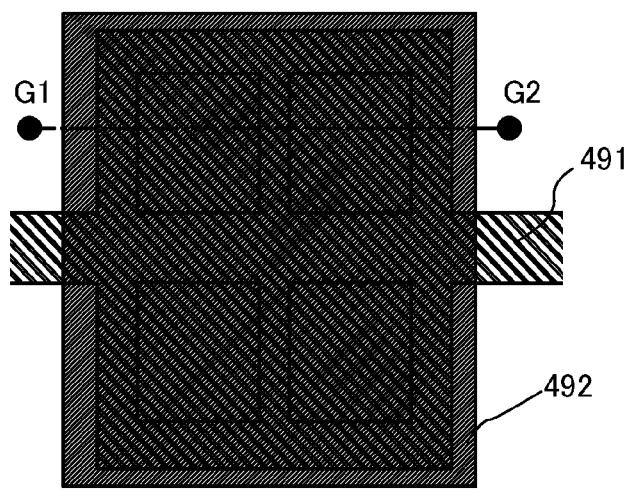
Figure 10C:
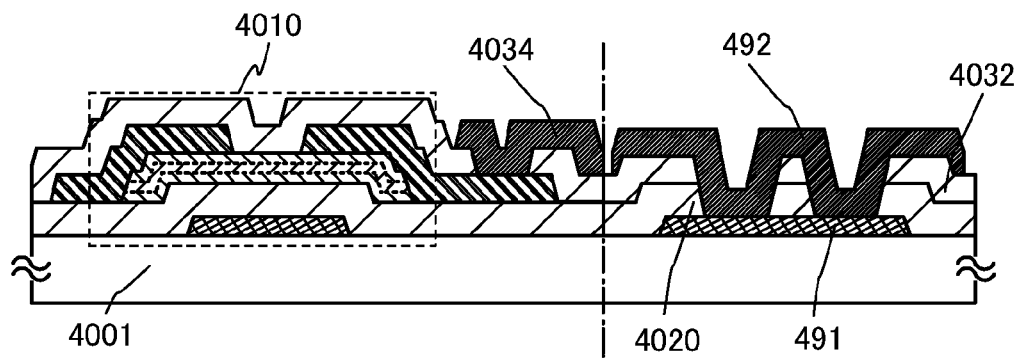

FIGS. 10A to 10C illustrate examples in which a common connection portion (pad portion) for electrical connection with the second electrode layer 4031 provided on the substrate 4006 is formed over the substrate 4001 in the display device in FIG. 5A or FIG. 5B.

The common connection portion is provided in a position that overlaps with a sealant for bonding the substrate 4001 and the substrate 4006, and is electrically connected to the second electrode layer 4031 via conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the second electrode layer 4031.

FIG. 10A is a cross-sectional view of the common connection portion and corresponds to a cross section along G1-G2 in the top view in FIG. 10B.

A common potential line 491 is provided over a gate insulating layer 4020, and is formed using a material and a process similar to those of the source and drain electrode layers of the transistors 4010 and 4011 illustrated in FIG. 5A or FIG. 5B.

Further, the common potential line 491 is covered with the insulating layer 4032, and the insulating layer 4032 includes a plurality of opening portions overlapping with the common potential line 491. The opening portions are formed in the same process as a contact hole for connecting one of the source and drain electrode layers of the transistor 4010 and the first electrode layer 4034.

A common electrode 492 is provided over the insulating layer 4032, and is formed using a material and a process similar to those of the connection terminal electrode 4015 and the first electrode layer 4034 in the pixel portion.

In this manner, the common connection portion can be formed by utilizing the process for manufacturing the switching element of the pixel portion 4002.

Note that the common electrode 492 is an electrode in contact with the conductive particles contained in the sealant, and is electrically connected to the second electrode layer 4031 of the substrate 4006.

As illustrated in FIG. 10C, the common potential line 491 may be formed using a material and a process similar to those of the gate electrode layers of the transistors 4010 and 4011.

In the common connection portion illustrated in FIG. 10C, the common potential line 491 is provided below the gate insulating layer 4020 and the insulating layer 4032, and the gate insulating layer 4020 and the insulating layer 4032 have a plurality of opening portions overlapping with the common potential line 491. The opening portions are formed in such a manner that the insulating layer 4032 is etched in the same process as the contact hole for connecting one of the source and drain electrode layers of the transistor 4010 and the first electrode layer 4034, and then the gate insulating layer 4020 is selectively etched.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of the pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figures 6A, 6B:
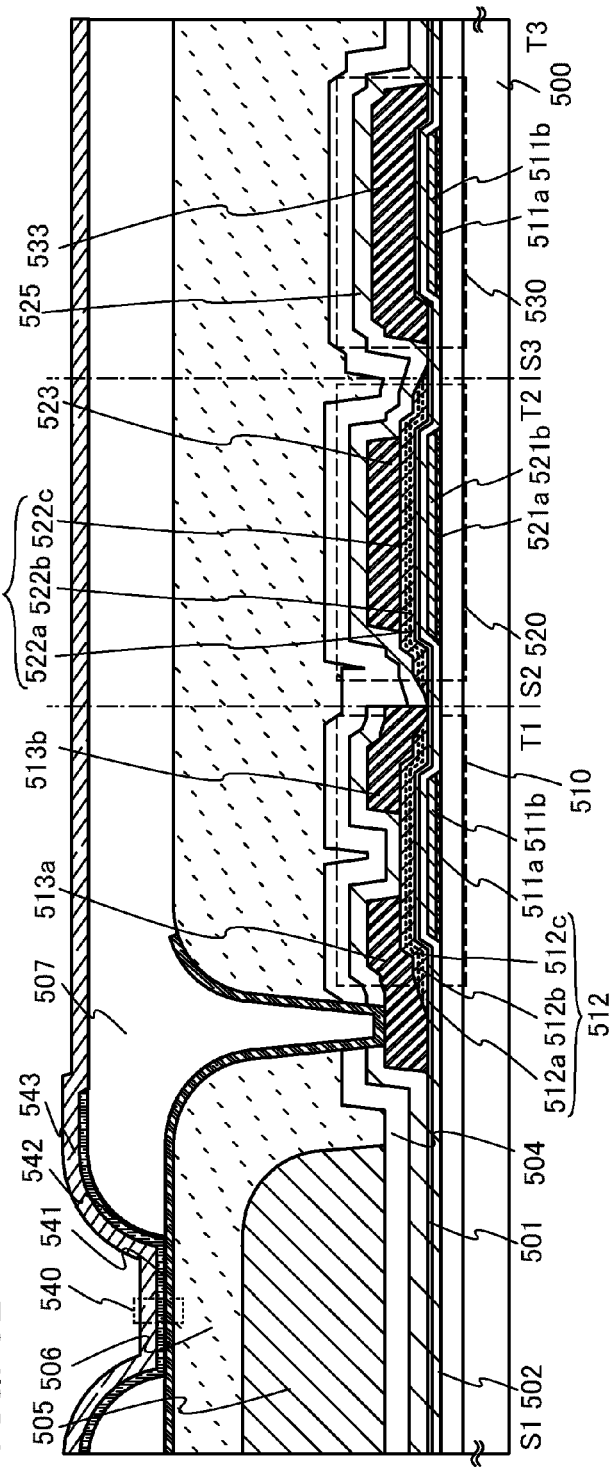
FIGS. 6A and 6B illustrate one embodiment of a semiconductor device.
Figure 11:
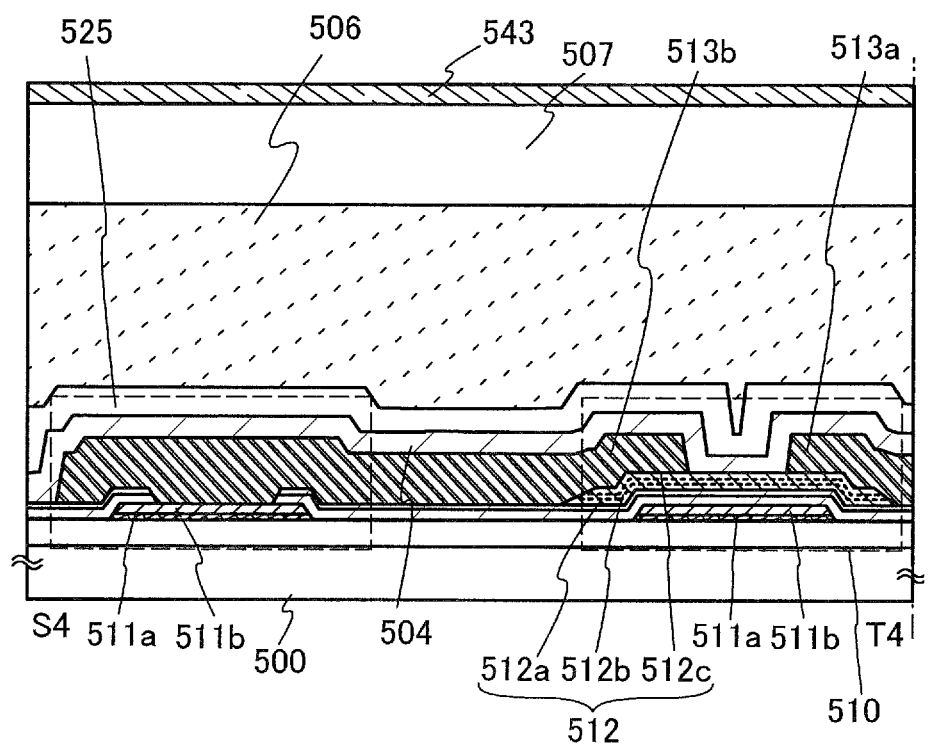
FIG. 11 illustrates one embodiment of a semiconductor device.

FIGS. 6A and 6B and FIG. 11 illustrate an example of a light-emitting device using a light-emitting element as a display element.

FIG. 6A is a plan view of the light-emitting device, and FIG. 6B is a cross-sectional view taken along dashed-dotted lines S1-T1, S2-T2, and S3-T3 in FIG. 6A. FIG. 11 is a cross-sectional view taken along a dashed-dotted line S4-T4 in FIG. 6A. Note that an electroluminescent layer 542 and a second electrode layer 543 are not illustrated in the plan view in FIG. 6A.

The light-emitting device illustrated in FIGS. 6A and 6B includes, over a substrate 500, a transistor 510, a capacitor 520, and a wiring layer intersection 530. The transistor 510 is electrically connected to a light-emitting element 540. Note that FIGS. 6A and 6B illustrate a bottom-emission light-emitting device in which light from the light-emitting element 540 is extracted through the substrate 500.

The transistor described in Embodiment 1 or Embodiment 2 can be applied to the transistor 510. In this embodiment, an example in which a transistor having a structure similar to that of the transistor 330 described in Embodiment 2 is used is described. The transistor 510 is a bottom-gate transistor.

The transistor 510 includes gate electrode layers 511a and 511b; gate insulating layers 501 and 502; an oxide semiconductor stack 512 including a first oxide semiconductor layer 512a, an n-type second oxide semiconductor layer 512b, and a third oxide semiconductor layer 512c; and conductive layers 513a and 513b serving as a source electrode layer and a drain electrode layer. In addition, an insulating layer 525 is formed over the transistor 510.

The capacitor 520 includes conductive layers 521a and 521b; the gate insulating layers 501 and 502; an oxide semiconductor stack 522 including a first oxide semiconductor layer 522a, an n-type second oxide semiconductor layer 522b, and a third oxide semiconductor layer 522c; and a conductive layer 523. The gate insulating layers 501 and 502 and the oxide semiconductor stack 522 are sandwiched between the conductive layer 523 and the conductive layers 521a and 521b, whereby the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating layers 501 and 502 provided therebetween.

In this embodiment, a 30-nm-thick titanium film is used as each of the gate electrode layer 511a and the conductive layer 521a, and a 200-nm-thick copper film is used as each of the gate electrode layer 511b and the conductive layer 521b. Thus, the gate electrode layer has a stacked-layer structure of the titanium film and the copper film.

In the transistor 510, a second oxide semiconductor layer which functions as a current path (channel) is sandwiched between a first oxide semiconductor layer and a third oxide semiconductor layer which have lower carrier densities than the second oxide semiconductor layer. Accordingly, the transistor 510 is a buried-channel transistor in which a current path is formed away from the interface with the insulating layer, and therefore has high field-effect mobility. In addition, the transistor 510 is a highly reliable transistor in which influence of an interface state which might be formed on the back channel side is reduced and photodegradation (e.g., negative-bias temperature stress photodegradation) is reduced.

Further, the transistor 510 includes a stack of a first nitrogen-containing silicon film which functions as a barrier film against copper and whose ammonia content is reduced, a second nitrogen-containing silicon film having a large thickness (e.g., 300 nm) in which the number of defects is reduced, and a third nitrogen-containing silicon film in which the hydrogen concentration is reduced as the gate insulating layer 502, and includes an oxide insulating layer as the gate insulating layer 501. With such a structure, the transistor 510 can have favorable electrical characteristics and electrostatic breakdown of the transistor 510 can be prevented. Accordingly, a highly reliable semiconductor device can be provided with high yield.

An interlayer insulating layer 504 is formed over the transistor 510, the capacitor 520, and the wiring layer intersection 530. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a 1500-nm-thick photosensitive acrylic film and a 1500-nm-thick photosensitive polyimide film can be used as the insulating layer 506 and the partition 507, respectively.

As the color filter layer 505, for example, a chromatic color light-transmitting resin can be used. As the chromatic color light-transmitting resin, a photosensitive organic resin or a non-photosensitive organic resin can be used. The photosensitive organic resin is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

The partition 507 can be formed using an organic insulating material or an inorganic insulating material. It is particularly preferable that the partition 507 be formed using a photosensitive resin material to have an opening over the first electrode layer 541. A sidewall of the opening is preferably formed as a tilted surface with continuous curvature.

The electroluminescent layer 542 may be formed using either a single layer or a stack of a plurality of layers.

A protective film may be formed over the second electrode layer 543 and the partition 507 in order to prevent entry of oxygen, hydrogen, moisture, carbon dioxide, or the like into the light-emitting element 540. As the protective film, a silicon nitride film, a silicon nitride oxide film, a DLC film, or the like can be formed.

Further, the light-emitting element 540 may be covered with a layer containing an organic compound deposited by an evaporation method so that oxygen, hydrogen, moisture, carbon dioxide, or the like do not enter the light-emitting element 540.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A dispersion of the above microcapsules in a solvent is referred to as electronic ink. Furthermore, by the use of a color filter or particles that have a pigment, color display is also possible.

The insulating layer 506 functioning as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 506 may be formed by stacking a plurality of insulating layers formed using any of these materials.

There is no particular limitation on the method of forming the insulating layer 506; the following method can be used depending on the material: a sputtering method, spin coating, dipping, spray coating, a droplet discharge method (such as an inkjet method), screen printing, offset printing, or the like.

Materials similar to those of the first electrode layer 4034 and the second electrode layer 4031 illustrated in FIG. 5A or FIG. 5B can be used for the first electrode layer 541 and the second electrode layer 543.

In this embodiment, since the light-emitting device illustrated in FIGS. 6A and 6B has a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive layer as the second electrode layer 543, a light-reflecting conductive layer is preferably stacked therewith.

A protection circuit for protecting the driver circuit may be provided. The protection circuit is preferably formed using a nonlinear element.

By using the transistor described in Embodiment 1 or Embodiment 2 as described above, the semiconductor device can have a variety of functions.

The structures, methods, and the like described in this embodiment can be combined as appropriate with any of the structures, methods, and the like described in the other embodiments.

Embodiment 5

A semiconductor device having an image sensor function of reading data on an object can be manufactured using the transistor described in Embodiment 1 or Embodiment 2.

Figure 7A:
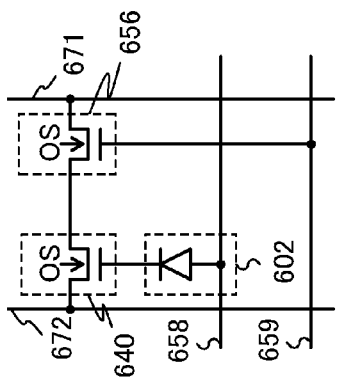
FIGS. 7A and 7B illustrate one embodiment of a semiconductor device.

An example of a semiconductor device having an image sensor function is illustrated in FIG. 7A. FIG. 7A illustrates an equivalent circuit of a photo sensor, and FIG. 7B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in circuit diagrams in this specification, a transistor using an oxide semiconductor layer is denoted by a symbol "OS" so that it can be identified as a transistor including an oxide semiconductor layer. In FIG. 7A, the transistor 640 and the transistor 656 are each a transistor using an oxide semiconductor layer, to which the transistor described in Embodiment 1 or Embodiment 2 can be applied. In this embodiment, an example in which a transistor having a structure similar to that of the transistor 310 described in Embodiment 1 is used is described. The transistor 640 is a bottom-gate transistor.

Figure 7B:
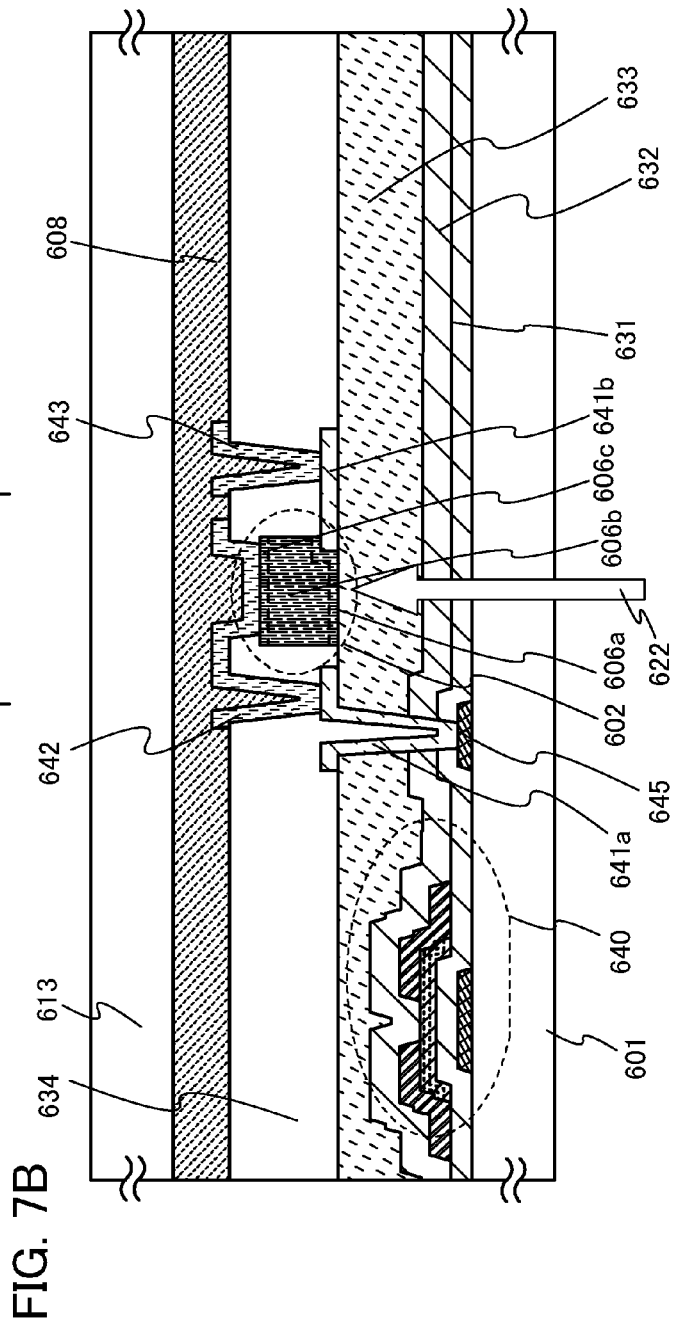

FIG. 7B is a cross-sectional view of the photodiode 602 and the transistor 640 in the photosensor. The photodiode 602 functioning as a sensor and the transistor 640 are provided over a substrate 601 (element substrate) having an insulating surface. A substrate 613 is provided over the photodiode 602 and the transistor 640 with the use of an adhesive layer 608.

An insulating layer 632, an interlayer insulating layer 633, and an interlayer insulating layer 634 are provided over the transistor 640. The photodiode 602 includes an electrode layer 641b formed over the interlayer insulating layer 633, semiconductor films (a first semiconductor film 606a, a second semiconductor film 606b, and a third semiconductor film 606c stacked over the electrode layer 641b in this order), an electrode layer 642 which is provided over the interlayer insulating layer 634 and electrically connected to the electrode layer 641b through the first to third semiconductor films, and an electrode layer 641a which is provided in the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive layer. A surface on the n-type semiconductor film side can alternatively be used as the light-receiving plane.

In the transistor 640, a second oxide semiconductor layer which functions as a current path (channel) is sandwiched between a first oxide semiconductor layer and a third oxide semiconductor layer which have lower carrier densities than the second oxide semiconductor layer. Accordingly, the transistor 640 is a buried-channel transistor in which a current path is formed away from the interface with the insulating layer, and therefore has high field-effect mobility. In addition, the transistor 640 is a highly reliable transistor in which influence of an interface state which might be formed on the back channel side is reduced and photodegradation (e.g., negative-bias temperature stress photodegradation) is reduced.

With the use of an insulating material, the insulating layer 632, the interlayer insulating layer 633, and the interlayer insulating layer 634 can be formed, depending on the material, using a sputtering method, a plasma CVD method, spin coating, dipping, spray coating, a droplet discharge method (such as an inkjet method), screen printing, offset printing, or the like.

For reduction of surface roughness, an insulating layer functioning as a planarization insulating layer is preferably used as each of the interlayer insulating layers 633 and 634. For the interlayer insulating layers 633 and 634, for example, an organic insulating material having heat resistance, such as polyimide, an acrylic resin, a benzocyclobutene-based resin, polyamide, or an epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object can be read. Note that a light source such as a backlight can be used at the time of reading information on an object.

The structures, methods, and the like described in this embodiment can be combined as appropriate with any of the structures, methods, and the like described in the other embodiments.

Embodiment 6

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 8A to 8C.

Figure 8A:
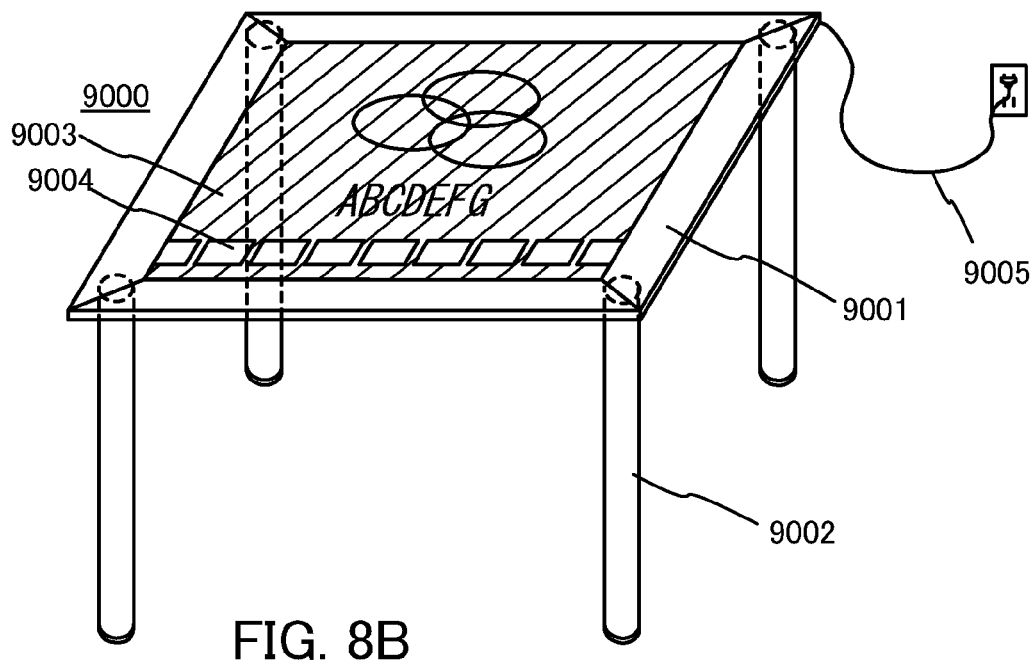
FIGS. 8A to 8C each illustrate an electronic device.
Figure 8B:
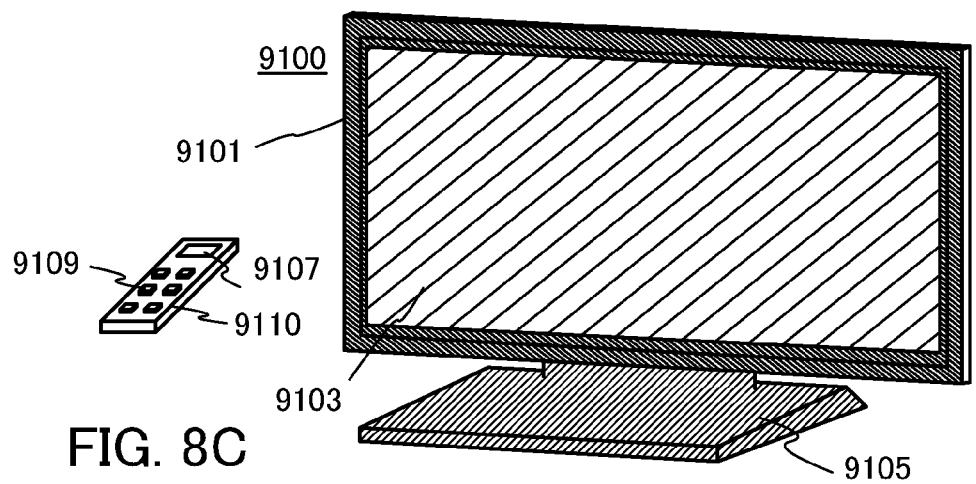
Figure 8C:
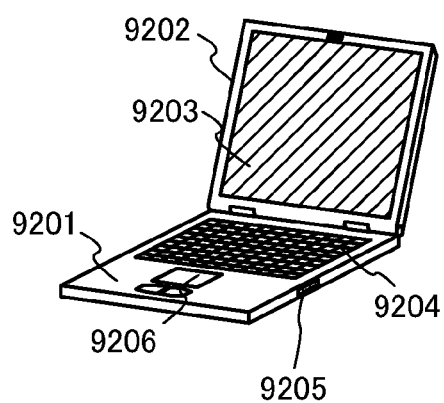

FIG. 8A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or controlling the home appliances, the table 9000 may function as a control device which controls the home appliances by operation on the screen. For example, with the use of the semiconductor device having an image sensor function described in Embodiment 3, the display portion 9003 can have a touch-input function.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 8B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 8B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used for the display portions 9103 and 9107, so that the television set and the remote controller can have high reliability.

FIG. 8C illustrates a computer which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

FIGS. 9A and 9B illustrate a tablet terminal that can be folded. The tablet terminal is opened in FIG. 9A. The tablet terminal includes a housing 9630, a display portion 9631*a*, a display portion 9631*b*, a display mode switch 9034, a power switch 9035, a power saver switch 9036, a clasp 9033, and an operation switch 9038.

The semiconductor device described in any of the above embodiments can be used for the display portion 9631*a* and the display portion 9631*b*, so that the tablet terminal can have high reliability.

Part of the display portion 9631*a* can be a touch panel region 9632*a*, and data can be input by touching operation keys 9638 that are displayed. Although a structure in which a half region in the display portion 9631*a* has only a display function and the other half region also has a touch panel function is shown as an example, the display portion 9631*a* is not limited to the structure. The whole display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed concurrently on the touch panel regions 9632*a* and 9632*b*.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631*a* and the display portion 9631*b* have the same display area in FIG. 9A, one embodiment of the present invention is not limited to this example. The display portion 9631*a* and the display portion 9631*b* may have different areas or different display quality. For example, one of them may be a display panel that can display higher-definition images than the other.

The tablet terminal is closed in FIG. 9B. The tablet terminal includes the housing 9630, a solar cell 9633, and a charge and discharge control circuit 9634. Note that FIG. 9B shows an example in which the charge and discharge control circuit 9634 includes a battery 9635 and a DCDC converter 9636.

Since the tablet terminal is foldable, the housing 9630 can be closed when the tablet terminal is not used. Thus, the display portion 9631*a* and the display portion 9631*b* can be protected, which makes it possible to provide a tablet terminal with excellent durability and excellent reliability for long-term use.

The tablet terminal illustrated in FIGS. 9A and 9B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and operation of the charge and discharge control circuit 9634 illustrated in FIG. 9B are described with reference to a block diagram of FIG. 9C. FIG. 9C illustrates the solar cell 9633, the battery 9635, the DCDC converter 9636, a converter 9637, switches SW1 to SW3, and a display portion 9631. The battery 9635, the DCDC converter 9636, the converter 9637, and the switches SW1 to SW3 correspond to the charge and discharge control circuit 9634 in FIG. 9B.

First, an example of the operation in the case where power is generated by the solar cell 9633 using external light is described. The voltage of power generated by the solar cell 9633 is stepped up or down by the DCDC converter 9636 so that the power has a voltage for charging the battery 9635.

Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

This application is based on Japanese Patent Application serial no. 2012-136437 filed with Japan Patent Office on Jun. 15, 2012, the entire contents of which are hereby incorporated by reference.

What is claimed is:

1. A semiconductor device comprising:
   a first oxide semiconductor film;
   a second oxide semiconductor film on and in contact with the first oxide semiconductor film;
   a third oxide semiconductor film on and in contact with the second oxide semiconductor film;
   a first oxide insulating film and a second oxide insulating film between which the first oxide semiconductor film, the second oxide semiconductor film, and the third oxide semiconductor film are positioned;
   a gate electrode overlapping with the first oxide semiconductor film, the second oxide semiconductor film, and the third oxide semiconductor film with the first oxide insulating film interposed therebetween;
   a source electrode and a drain electrode each electrically connected to at least one of the first oxide semiconductor film, the second oxide semiconductor film, and the third oxide semiconductor film,
   wherein a difference between a Fermi level and a bottom of a conduction band in the second oxide semiconductor film is smaller than those in the first oxide semiconductor film and the third oxide semiconductor film.

2. The semiconductor device according to claim 1, wherein the second oxide semiconductor film comprises an impurity imparting an n-type conductivity.

3. The semiconductor device according to claim 2, wherein the impurity is at least any one of boron, nitrogen, and phosphorus.

4. The semiconductor device according to claim 1, wherein each of the first oxide semiconductor film and the third oxide semiconductor film is an i-type oxide semiconductor film.

5. The semiconductor device according to claim 1, wherein the second oxide semiconductor film has a carrier density higher than the first oxide semiconductor film and the third oxide semiconductor film.

6. The semiconductor device according to claim 1, wherein the bottom of the conduction band of the second oxide semiconductor film is lower than those of the first oxide semiconductor film and the third oxide semiconductor film.

7. The semiconductor device according to claim 1, wherein each of the first oxide, insulating film and the second oxide insulating film is a silicon oxide film.

8. The semiconductor device according to claim 1, wherein each of the first oxide semiconductor film, the second oxide semiconductor film, and the third oxide semiconductor film comprises indium, gallium, and zinc.

9. The semiconductor device according to claim 1, wherein each of the first oxide semiconductor film, the second oxide semiconductor film, and the third oxide semiconductor film is positioned over the gate electrode.

10. The semiconductor device according to claim 1, wherein each of the source electrode and the drain electrode is on and in contact with the third oxide semiconductor film.

11. A semiconductor device comprising:
    a first oxide semiconductor film;
    a second oxide semiconductor film on and in contact with the first oxide semiconductor film;
    a third oxide semiconductor film on and in contact with the second oxide semiconductor film;
    a first oxide insulating film and a second oxide insulating film between which the first oxide semiconductor film, the second oxide semiconductor film, and the third oxide semiconductor film are positioned;
    a first nitride insulating film and a second nitride insulating film between which the first oxide insulating film, the first oxide semiconductor film, the second oxide semiconductor film, the third oxide semiconductor film and the second oxide insulating film are positioned;
    a gate electrode overlapping with the first oxide semiconductor film, the second oxide semiconductor film, and the third oxide semiconductor film with the first oxide insulating film and the first nitride insulating film interposed therebetween;
    a source electrode and a drain electrode each electrically connected to at least one of the first oxide semiconductor film, the second oxide semiconductor film, and the third oxide semiconductor film,
    wherein a difference between a Fermi level and a bottom of a conduction band in the second oxide semiconductor film is smaller than those in the first oxide semiconductor film and the third oxide semiconductor film.

12. The semiconductor device according to claim 11, wherein the second oxide semiconductor film comprises an impurity imparting an n-type conductivity.

13. The semiconductor device according to claim 12, wherein the impurity is at least any one of boron, nitrogen, and phosphorus.

14. The semiconductor device according to claim 11, wherein each of the first oxide semiconductor film and the third oxide semiconductor film is an i-type oxide semiconductor film.

15. The semiconductor device according to claim 11, wherein the second oxide semiconductor film has a carrier density higher than the first oxide semiconductor film and the third oxide semiconductor film.

16. The semiconductor device according to claim 11, wherein the bottom of the conduction band of the second oxide semiconductor film is lower than those of the first oxide semiconductor film and the third oxide semiconductor film.

17. The semiconductor device according to claim 11, wherein each of the first oxide insulating film and the second oxide insulating film is a silicon oxide film.

18. The semiconductor device according to claim 11, wherein each of the first nitride insulating film and the second nitride insulating film is a silicon nitride film.

19. The semiconductor device according to claim 11, wherein each of the first oxide semiconductor film, the second oxide semiconductor film, and the third oxide semiconductor film comprises indium, gallium, and zinc.

20. The semiconductor device according to claim 11, wherein each of the first oxide semiconductor film, the second oxide semiconductor film, and the third oxide semiconductor film is positioned over the gate electrode.

21. The semiconductor device according to claim 11, wherein each of the source electrode and the drain electrode is on and in contact with the third oxide semiconductor film.

22. A semiconductor device comprising:
  a gate electrode:
  a first gate insulating film over the gate electrode;
  a second gate insulating film over the first gate insulating film;
  a first oxide semiconductor film on and in contact with the second gate insulating film;
  a second oxide semiconductor film on and in contact with the first oxide semiconductor film;
  a third oxide semiconductor film on and in contact with the second oxide semiconductor film;
  a source electrode and a drain electrode on and in contact with a top surface of the third oxide semiconductor film and in contact with side surfaces of the first oxide semiconductor film, the second oxide semiconductor film, and the third oxide semiconductor film;
  an oxide insulating film on and in contact with the third oxide semiconductor film, the source electrode, and the drain electrode; and
  a nitride insulating film over the oxide insulating film,
  wherein a difference between a Fermi level and a bottom of a conduction band in the second oxide semiconductor film is smaller than those in the first oxide semiconductor film and the third oxide semiconductor film.

23. The semiconductor device according to claim 22, wherein the second oxide semiconductor film comprises an impurity imparting an n-type conductivity.

24. The semiconductor device according to claim 23, wherein the impurity is at least any one of boron, nitrogen, and phosphorus.

25. The semiconductor device according to claim 22, wherein each of the first oxide semiconductor film and the third oxide semiconductor film is an i-type oxide semiconductor film.

26. The semiconductor device according to claim 22, wherein the second oxide semiconductor film has a carrier density higher than the first oxide semiconductor film and the third oxide semiconductor film.

27. The semiconductor device according to claim 22, wherein the bottom of the conduction band of the second oxide semiconductor film is lower than those of the first oxide semiconductor film and the third oxide semiconductor film.

28. The semiconductor device according to claim 22, wherein each of the second gate insulating film and the oxide insulating film is a silicon oxide film.

29. The semiconductor device according to claim 22, wherein each of the first gate insulating film and the nitride insulating film is a silicon nitride film.

30. The semiconductor device according to claim 22, wherein each of the first oxide semiconductor film, the second oxide semiconductor film, and the third oxide semiconductor film comprises indium, gallium, and zinc.

31. The semiconductor device according to claim 1, wherein each of the first oxide semiconductor film, the second oxide semiconductor film, and the third oxide semiconductor film comprises a crystal part.

32. The semiconductor device according to claim 1, wherein each of the first oxide semiconductor film, the second oxide semiconductor film, and the third oxide semiconductor film is a c-axis aligned crystalline oxide semiconductor (CAAC-OS) film.

33. The semiconductor device according to claim 11, wherein each of the first oxide semiconductor film, the second oxide semiconductor film, and the third oxide semiconductor film comprises a crystal part.

34. The semiconductor device according to claim 11, wherein each of the first oxide semiconductor film, the second oxide semiconductor film, and the third oxide semiconductor film is a c-axis aligned crystalline oxide semiconductor (CAAC-OS) film.

35. The semiconductor device according to claim 22, wherein each of the first oxide semiconductor film, the second oxide semiconductor film, and the third oxide semiconductor film comprises a crystal part.

36. The semiconductor device according to claim 22, wherein each of the first oxide semiconductor film, the second oxide semiconductor film, and the third oxide semiconductor film is a c-axis aligned crystalline oxide semiconductor (CAAC-OS) film.

37. A semiconductor device comprising:
  a first oxide semiconductor film;
  a second oxide semiconductor film on and in contact with the first oxide semiconductor film;
  a third oxide semiconductor film on and in contact with the second oxide semiconductor film;
  a first oxide insulating film and a second oxide insulating film between which the first oxide semiconductor film, the second oxide semiconductor film, and the third oxide semiconductor film are positioned;
  a gate electrode overlapping with the first oxide semiconductor film, the second oxide semiconductor film, and the third oxide semiconductor film with the first oxide insulating film interposed therebetween;
  a source electrode and a drain electrode each electrically connected to at least one of the first oxide semiconductor film, the second oxide semiconductor film, and the third oxide semiconductor film,
  wherein a difference between a Fermi level and a bottom of a conduction band in the second oxide semiconductor film is smaller than those in the first oxide semiconductor film and the third oxide semiconductor film, and
  wherein the third oxide semiconductor film is in contact with a side surface of the first oxide semiconductor film and in contact with a side surface and a top surface of the second oxide semiconductor film.

38. The semiconductor device according to claim 37, wherein the second oxide semiconductor film comprises an impurity imparting an n-type conductivity.

39. The semiconductor device according to claim 38, wherein the impurity is at least any one of boron, nitrogen, and phosphorus.

40. The semiconductor device according to claim 37, wherein each of the first oxide semiconductor film and the third oxide semiconductor film is an i-type oxide semiconductor film.

41. The semiconductor device according to claim 37, wherein the second oxide semiconductor film has a carrier density higher than the first oxide semiconductor film and the third oxide semiconductor film.

42. The semiconductor device according to claim 37, wherein the bottom of the conduction band of the second oxide semiconductor film is lower than those of the first oxide semiconductor film and the third oxide semiconductor film.

43. The semiconductor device according to claim 37, wherein each of the first oxide insulating film and the second oxide insulating film is a silicon oxide film.

44. The semiconductor device according to claim 37, wherein each of the first oxide semiconductor film, the second oxide semiconductor film, and the third oxide semiconductor film comprises indium, gallium, and zinc.

45. The semiconductor device according to claim 37, wherein each of the first oxide semiconductor film, the second oxide semiconductor film, and the third oxide semiconductor film is positioned over the gate electrode.

46. The semiconductor device according to claim 37, wherein each of the source electrode and the drain electrode is on and in contact with the third oxide semiconductor film.

47. The semiconductor device according to claim 37, wherein each of the first oxide semiconductor film, the second oxide semiconductor film, and the third oxide semiconductor film comprises a crystal part.

48. The semiconductor device according to claim 37, wherein each of the first oxide semiconductor film, the second oxide semiconductor film, and the third oxide semiconductor film is a c-axis aligned crystalline oxide semiconductor (CAAC-OS) film.

49. A semiconductor device comprising:
a first oxide semiconductor film;
a second oxide semiconductor film on and in contact with the first oxide semiconductor film;
a third oxide semiconductor film on and in contact with the second oxide semiconductor film;
a first oxide insulating film and a second oxide insulating film between which the first oxide semiconductor film, the second oxide semiconductor film, and the third oxide semiconductor film are positioned;
a gate electrode overlapping with the first oxide semiconductor film, the second oxide semiconductor film, and the third oxide semiconductor film with the first oxide insulating film interposed therebetween;
a source electrode and a drain electrode each electrically connected to at least one of the first oxide semiconductor film, the second oxide semiconductor film, and the third oxide semiconductor film,
wherein a difference between a Fermi level and a bottom of a conduction band in the second oxide semiconductor film is smaller than those in the first oxide semiconductor film and the third oxide semiconductor film, and
wherein the third oxide semiconductor film is in contact with a side surface and a top surface of the second oxide semiconductor film.

50. The semiconductor device according to claim 37, wherein the second oxide semiconductor film comprises an impurity imparting an n-type conductivity.

51. The semiconductor device according to claim 50, wherein the impurity is at least any one of boron, nitrogen, and phosphorus.

52. The semiconductor device according to claim 49, wherein each of the first oxide semiconductor film and the third oxide semiconductor film is an i-type oxide semiconductor film.

53. The semiconductor device according to claim 49, wherein the second oxide semiconductor film has a carrier density higher than the first oxide semiconductor film and the third oxide semiconductor film.

54. The semiconductor device according to claim 49, wherein the bottom of the conduction band of the second oxide semiconductor film is lower than those of the first oxide semiconductor film and the third oxide semiconductor film.

55. The semiconductor device according to claim 49, wherein each of the first oxide insulating film and the second oxide insulating film is a silicon oxide film.

56. The semiconductor device according to claim 49, wherein each of the first oxide semiconductor film, the second oxide semiconductor film, and the third oxide semiconductor film comprises indium, gallium, and zinc.

57. The semiconductor device according to claim 49, wherein each of the first oxide semiconductor film, the second oxide semiconductor film, and the third oxide semiconductor film is positioned over the gate electrode.

58. The semiconductor device according to claim 49, wherein each of the source electrode and the drain electrode is on and in contact with the third oxide semiconductor film.

59. The semiconductor device according to claim 49, wherein each of the first oxide semiconductor film, the second oxide semiconductor film, and the third oxide semiconductor film comprises a crystal part.

60. The semiconductor device according to claim 49, wherein each of the first oxide semiconductor film, the second oxide semiconductor film, and the third oxide semiconductor film is a c-axis aligned crystalline oxide semiconductor (CAAC-OS) film.

* * * * *

UNITED STATES PATENT AND TRADEMARK OFFICE
CERTIFICATE OF CORRECTION

PATENT NO.       : 9,490,369 B2
APPLICATION NO.  : 14/556371
DATED            : November 8, 2016
INVENTOR(S)      : Shunpei Yamazaki It is certified that error appears in the above-identified patent and that said Letters Patent is hereby corrected as shown below:

In the Specification

At Column 4, Line 17, "layer Si" should be --layer S1--;

At Column 4, Line 62, "layer Si" should be --layer S1--;

At Column 8, Line 63, "elements)" should be --element(s)--;

At Column 10, Line 47, "nm The" should be --nm. The--;

At Column 21, Line 42, "nm The" should be --nm. The--;

At Column 21, Line 46, "nm The" should be --nm. The--;

In the Claims

In Claim 7, at Column 40, Line 5, "oxide," should be --oxide--.

Signed and Sealed this
Sixteenth Day of May, 2017

Michelle K. Lee
*Director of the United States Patent and Trademark Office*